United States Patent
Son

(10) Patent No.: US 12,223,886 B2
(45) Date of Patent: Feb. 11, 2025

(54) DISPLAY APPARATUS INCLUDING LIGHT EMITTING DEVICE AND PIXEL DRIVING CIRCUIT

(71) Applicant: LG Display Co., Ltd., Seoul (KR)

(72) Inventor: Kyung Mo Son, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/485,944

(22) Filed: Oct. 12, 2023

(65) Prior Publication Data

US 2024/0194126 A1 Jun. 13, 2024

(30) Foreign Application Priority Data

Dec. 12, 2022 (KR) .................. 10-2022-0172483

(51) Int. Cl.
| | |
|---|---|
| *G09G 3/32* | (2016.01) |
| *H01L 25/075* | (2006.01) |
| *H01L 25/16* | (2023.01) |
| *H01L 33/62* | (2010.01) |

(52) U.S. Cl.
CPC ........... *G09G 3/32* (2013.01); *H01L 25/0753* (2013.01); *H01L 25/167* (2013.01); *H01L 33/62* (2013.01); *G09G 2310/0294* (2013.01)

(58) Field of Classification Search
CPC ... G09G 2300/0426; G09G 2300/0842; G09G 2300/0819; G09G 2300/0861; G09G 2300/0452; G09G 2300/0852; G09G 2300/0814; G09G 2300/0809; G09G 3/3233; G09G 3/3648; G09G 3/3225; G09G 3/3266; G09G 3/32; G09G 3/3208; G09G 3/20; G09G 3/3677; G09G 3/3688; G09G 2310/08; G09G 2310/0251; G09G 2310/0286; G09G 2330/021
See application file for complete search history.

(56) References Cited

U.S. PATENT DOCUMENTS

| | | | | |
|---|---|---|---|---|
| 2002/0145683 | A1* | 10/2002 | Murade | G02F 1/136227 349/43 |
| 2020/0210010 | A1* | 7/2020 | Kim | G09G 3/3233 |
| 2021/0175461 | A1* | 6/2021 | Youn | H10K 71/00 |
| 2021/0202676 | A1* | 7/2021 | Jeong | G09G 3/3266 |
| 2021/0202906 | A1* | 7/2021 | Kim | H10K 50/844 |
| 2022/0028954 | A1* | 1/2022 | Li | H10K 59/38 |

* cited by examiner

*Primary Examiner* — Dong Hui Liang
(74) *Attorney, Agent, or Firm* — Seed IP Law Group LLP

(57) ABSTRACT

A display apparatus including a light emitting device and a pixel driving circuit is disclosed. The pixel driving circuit supplies drive current corresponding to a data signal. The pixel driving circuit includes a driving thin film transistor and switching thin film transistors. The switching thin film transistors include a sampling thin film transistor electrically connected between a driving gate electrode and a driving source electrode of the driving thin film transistor. A sampling semiconductor pattern of the sampling thin film transistor is disposed between a sampling light shielding pattern and a sampling gate electrode of the sampling thin film transistor. A cross-section of at least one of the sampling light shielding pattern or the sampling gate electrode has a concave shape with reference to the sampling semiconductor pattern. A variation in characteristics of the sampling thin film transistor by light emitted from the light emitting device is prevented.

20 Claims, 15 Drawing Sheets

DISPLAY APPARATUS INCLUDING LIGHT EMITTING DEVICE AND PIXEL DRIVING CIRCUIT

CROSS-REFERENCE TO RELATED APPLICATION(S)

This application claims the benefit of Korean Patent Application No. 10-2022-0172483, filed on Dec. 12, 2022, which is hereby incorporated by reference as if fully set forth herein.

BACKGROUND

Technical Field

The present disclosure relates to a display apparatus in which a light emitting device and a pixel driving circuit are disposed in each pixel area.

Description of the Related Art

Generally, a display apparatus may provide an image to a user. For example, the display apparatus may include a plurality of pixel areas. Each pixel area may render a particular color. For example, a light emitting device and a pixel driving circuit may be disposed in each pixel area.

The light emitting device may emit light representing a particular color. For example, the light emitting device may include an emission layer disposed between a first electrode and a second electrode. The pixel driving circuit may supply drive current corresponding to a data signal for one frame in accordance with a gate signal. For example, the pixel driving circuit may include a driving thin film transistor and at least one switching thin film transistor.

One frame may include a period for sampling a threshold voltage of the driving thin film transistor. During the sampling period, the driving thin film transistor may be in a diode connection state. For example, the pixel driving circuit may include a sampling thin film transistor electrically connected between a driving gate electrode and a driving source electrode of the driving thin film transistor.

BRIEF SUMMARY

In the display apparatus, the drive current generated by the pixel driving circuit may be greatly varied even due to minute variation in characteristics of the sampling thin film transistor. For example, in the display apparatus, when light emitted from the light emitting device enters a channel region of a sampling semiconductor pattern in the sampling thin film transistor in accordance with inward reflection thereof, the threshold voltage of the driving thin film transistor may be greatly varied. As a result, in the display apparatus, image quality may be degraded due to the variation in drive current as mentioned above.

Various embodiments of the present disclosure address the technical problems in the related art including the above-identified technical problem. Namely, the present disclosure is directed to a display apparatus including a light emitting device and a pixel driving circuit that substantially obviates one or more problems due to limitations and disadvantages of the related art.

Various embodiments of the present disclosure provide a display apparatus configured to prevent a variation in characteristics of a sampling thin film transistor.

Various embodiments of the present disclosure provide a display apparatus configured to prevent introduction of light into a channel region of a sampling semiconductor pattern disposed in each pixel region.

Technical benefits of the present disclosure are not limited to the above-described benefits, and other benefits of the present disclosure not yet described will be more clearly understood by those skilled in the art from the following detailed description.

To achieve these benefits and other advantages and in accordance with the purpose of the disclosure, as embodied and broadly described herein, a display apparatus includes a device substrate. A pixel driving circuit, a sampling light shielding pattern, and a light emitting device are disposed on the device substrate. The pixel driving circuit includes a driving thin film transistor and a sampling thin film transistor. The sampling thin film transistor is electrically connected between a driving gate electrode and a driving source electrode of the driving thin film transistor. The sampling light shielding pattern is disposed between the device substrate and a sampling semiconductor pattern of the sampling thin film transistor. A cross-section of at least one of the sampling light shielding pattern or a sampling gate electrode of the sampling thin film transistor has a concave shape with reference to the sampling semiconductor pattern. The light emitting device is electrically connected to the pixel driving circuit.

Each of the sampling light shielding pattern and the sampling gate electrode may include a metal.

The driving thin film transistor may include a driving semiconductor pattern. The driving semiconductor pattern may be disposed on the same layer as the sampling semiconductor pattern. Each of the driving semiconductor pattern and the sampling semiconductor pattern may include an oxide semiconductor.

The driving semiconductor pattern may include a material identical to a material of the sampling semiconductor pattern.

A driving light shielding pattern may be disposed between the device substrate and a driving semiconductor pattern of the driving thin film transistor. A lower buffer layer may be disposed between the device substrate and the driving light shielding pattern. The lower buffer layer may include a lower hole. The lower hole may overlap with a channel region of the sampling semiconductor pattern. A side wall and a bottom surface of the lower hole may be covered by the sampling light shielding pattern.

The sampling light shielding pattern may contact the device substrate within the lower hole.

The sampling light shielding pattern may be disposed on a layer different from a layer on which the driving light shielding pattern is disposed.

The sampling light shielding pattern and the sampling gate electrode may extend across a channel region of the sampling semiconductor pattern in a width direction of the sampling semiconductor pattern.

In another aspect of the present disclosure, a display apparatus includes a device substrate. A sampling light shielding pattern and an upper buffer layer are disposed on the device substrate. The upper buffer layer covers the sampling light shielding pattern. A pixel driving circuit and a light emitting device are disposed on the upper buffer layer. The pixel driving circuit includes a driving thin film transistor and a plurality of switching thin film transistors. The plurality of switching thin film transistors includes a sampling thin film transistor. The sampling thin film transistor is electrically connected between a driving gate electrode and a driving source electrode of the driving thin film transistor. The sampling thin film transistor includes a sampling gate electrode and a sampling semiconductor pattern. The sampling gate electrode overlaps with the sampling light shielding pattern. The sampling semiconductor pattern is disposed between the sampling light shielding pattern and the sampling gate electrode. The sampling gate electrode includes a first electrode region extending onto a first side surface of the sampling semiconductor pattern. The light emitting device is electrically connected to the pixel driving circuit.

The minimum distance between the device substrate and the first electrode region may be smaller than the minimum distance between the device substrate and the sampling semiconductor pattern.

The sampling gate electrode may be electrically connected to the sampling light shielding pattern.

The first electrode region of the sampling gate electrode may contact the sampling light shielding pattern.

The sampling semiconductor pattern may include a second side surface opposite to the first side surface. The sampling gate electrode may include a second electrode region extending onto the second side surface of the sampling semiconductor pattern.

An upper gate insulating layer may be disposed between the sampling semiconductor pattern and the sampling gate electrode. The upper gate insulating layer may include a first light shielding trench and a second light shielding trench. The first light shielding trench may be disposed on the first side surface of the sampling semiconductor pattern. The second light shielding trench may be disposed on the second side surface of the sampling semiconductor pattern. The first light shielding trench and the second light shielding trench may be spaced apart from the sampling semiconductor pattern. A side wall and a bottom surface of the first light shielding trench may be covered by the first electrode region. A side wall and a bottom surface of the second light shielding trench may be covered by the second electrode region.

A lower buffer layer may be disposed between the device substrate and the upper buffer layer. The lower buffer layer may include a lower hole overlapping with a channel region of the sampling semiconductor pattern. The sampling light shielding pattern may along a side wall and a bottom surface of the lower hole.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiment(s) of the disclosure and along with the description serve to explain the principle of the disclosure. In the drawings.

DETAILED DESCRIPTION

Figure 1:
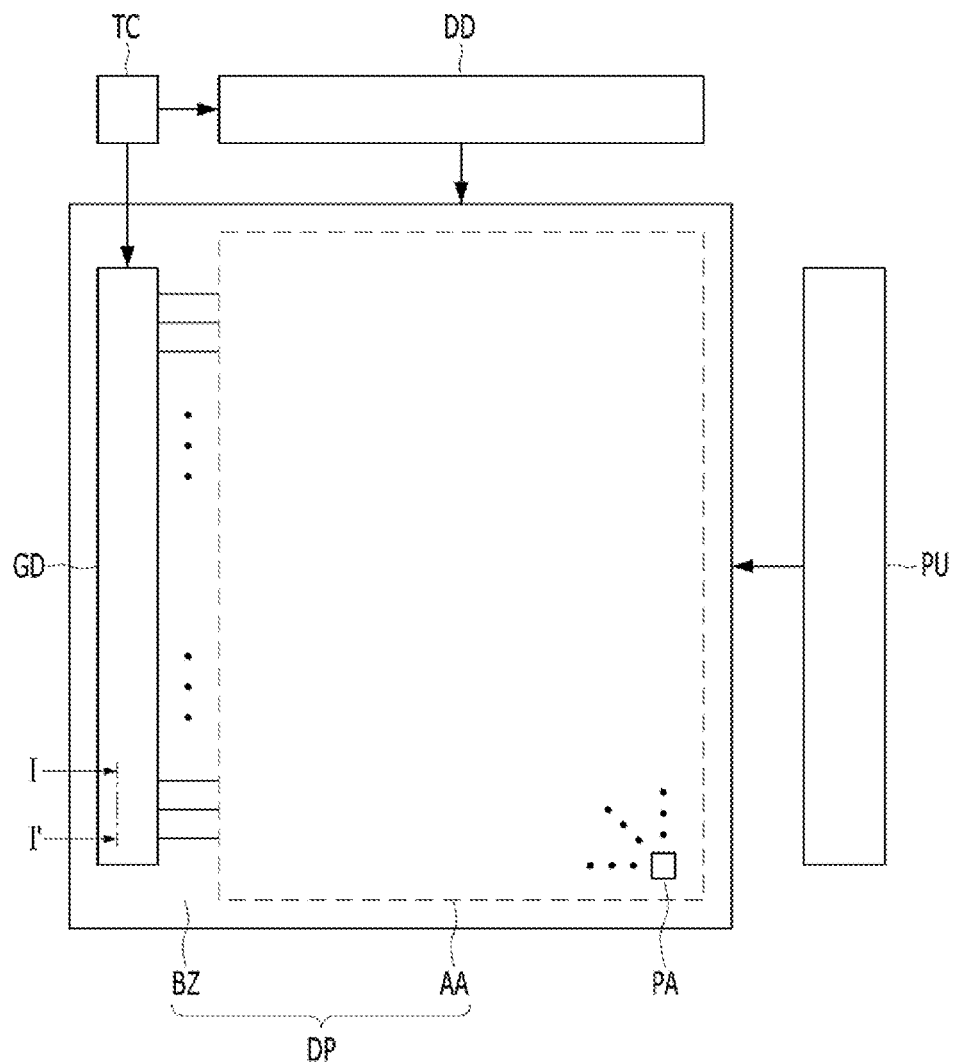
FIG. 1 is a diagram schematically showing a display apparatus according to an embodiment of the present disclosure.

Details of objects and technical configurations of the present disclosure, and functions and effects thereof will be clarified through the following detailed description given with reference to the accompanying drawings illustrating embodiments of the present disclosure. Here, embodiments of the present disclosure are provided so that the present disclosure may be sufficiently thorough and complete to assist those skilled in the art in fully understanding the scope of the present disclosure. Therefore, the present disclosure may be embodied in different forms and should not be construed as limited to the embodiments set forth herein.

Throughout the specification, elements designated by the same reference numerals represent the same constituent elements. In the drawings, the length and thickness of each layer or region may be exaggerated for convenience. In addition, it will be understood that the case in which a first element is referred to as being "on" a second constituent element includes not only the case in which the first constituent element is disposed on the second constituent element such that the first constituent element directly contacts the second constituent element, but also the case in which a third constituent element is interposed between the first constituent element and the second constituent element.

It will be understood that although the terms "first," "second," or the like are used herein to describe various constituent elements, these terms are only used to distinguish one constituent element from another constituent element. Of course, the first constituent element and the second constituent element may be optionally named in accordance with convenience of those skilled in the art.

The terminology used in the specification of the present disclosure is for the purpose of describing particular embodiments only and is not intended to limit the present disclosure. For example, a constituent element expressed in the singular form is intended to include a plurality of constituent elements, unless the context clearly indicates otherwise. It will be further understood that the terms "comprising" or "having" when used in the specification of the present disclosure specify the presence of stated features, integers, steps, operations, elements, components or combinations thereof, but do not preclude the presence or addition of one or more other features, integers, steps, operations, elements, components, or combinations thereof.

Unless otherwise defined, all terms including technical and scientific terms used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Embodiments

Figure 2:
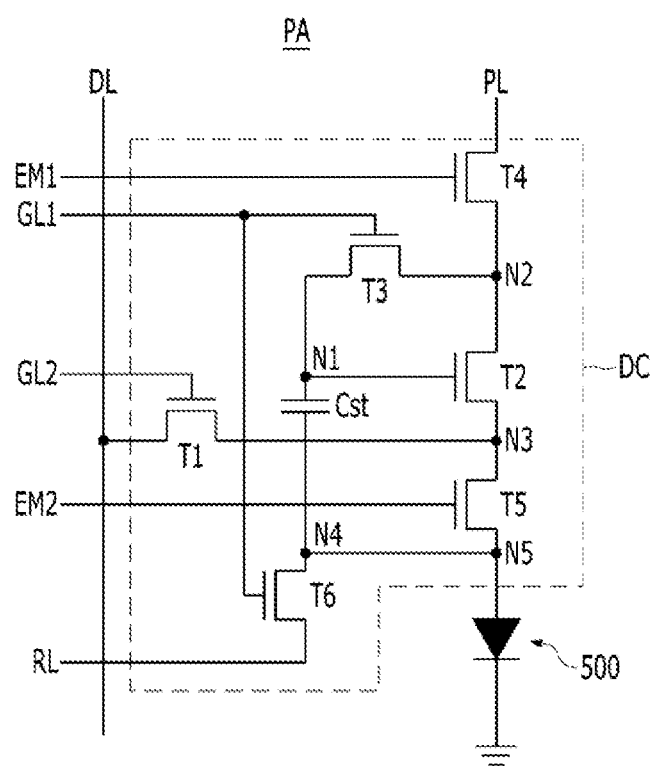
FIG. 2 is a circuit diagram showing a circuit in a unit pixel area in the display apparatus according to the embodiment of the present disclosure.

FIG. 1 is a diagram schematically showing a display apparatus according to an embodiment of the present disclosure. FIG. 2 is a circuit diagram showing a circuit in a unit pixel area in the display apparatus according to the embodiment of the present disclosure.

Referring to FIGS. 1 and 2, the display apparatus according to the embodiment of the present disclosure may include a display panel DP. The display panel DP may produce an image to be provided to a user. For example, the display panel DP may include a plurality of pixel areas PA.

Various signals may be provided to each pixel area PA through signal lines GL1, GL2, DL, EM1, EM2, PL, and RL. For example, the signal lines GL1, GL2, DL, EM1, EM2, PL, and RL may include gate lines GL1 and GL2 each configured to apply a gate signal to each pixel area PA, data lines DL each configured to apply a data signal to each pixel area PA, emission control lines EM1 and EM2 each configured to apply an emission control signal to each pixel area PA, supply voltage supply lines PL each configured to supply a positive supply voltage VDD to each pixel area PA, and reference voltage supply lines RL each configured to supply a reference voltage to each pixel area PA. The gate lines GL1 and GL2 and the emission control lines EM1 and EM2 may be electrically connected to a gate driver GD. The data lines DL may be electrically connected to a data driver DD. The supply voltage supply lines PL and the reference voltage supply lines RL may be electrically connected to a power unit PU.

The gate driver GD and the data driver DD may be controlled by a timing controller TC. For example, the gate driver GD may receive clock signals, reset signals, and a start signal from the timing controller TC, and the data driver DD may receive digital video data and a source timing signal from the timing controller TC.

Each pixel area PA may render a particular color. For example, a light emitting device 500 and a pixel driving circuit DC electrically connected to the light emitting device 500 may be disposed in each pixel area PA. The pixel driving circuit DC of each pixel area PA may generate drive current corresponding to the data signal DL in accordance with the gate signals GL1 and GL2. For example, the pixel driving circuit DC of each pixel area PA may include a first thin film transistor T1, a second thin film transistor T2, a third thin film transistor T3, a fourth thin film transistor T4, a fifth thin film transistor T5, a sixth thin film transistor T6, and a storage capacitor Cst.

Figure 3:
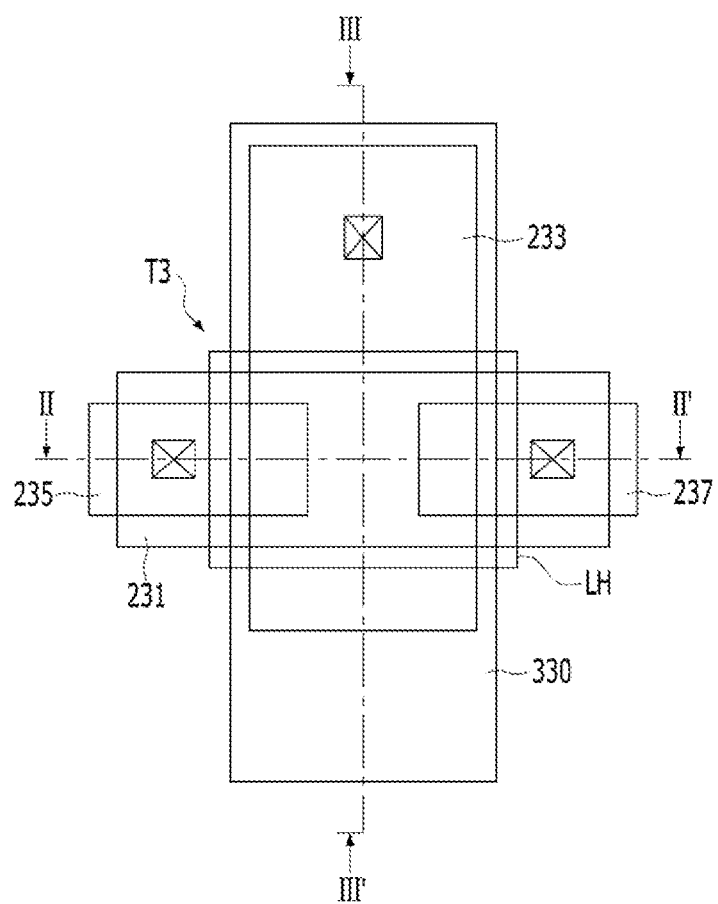
FIG. 3 is a view schematically showing a layout of a third thin film transistor disposed in each pixel area in the display apparatus according to the embodiment of the present disclosure.
Figure 4:
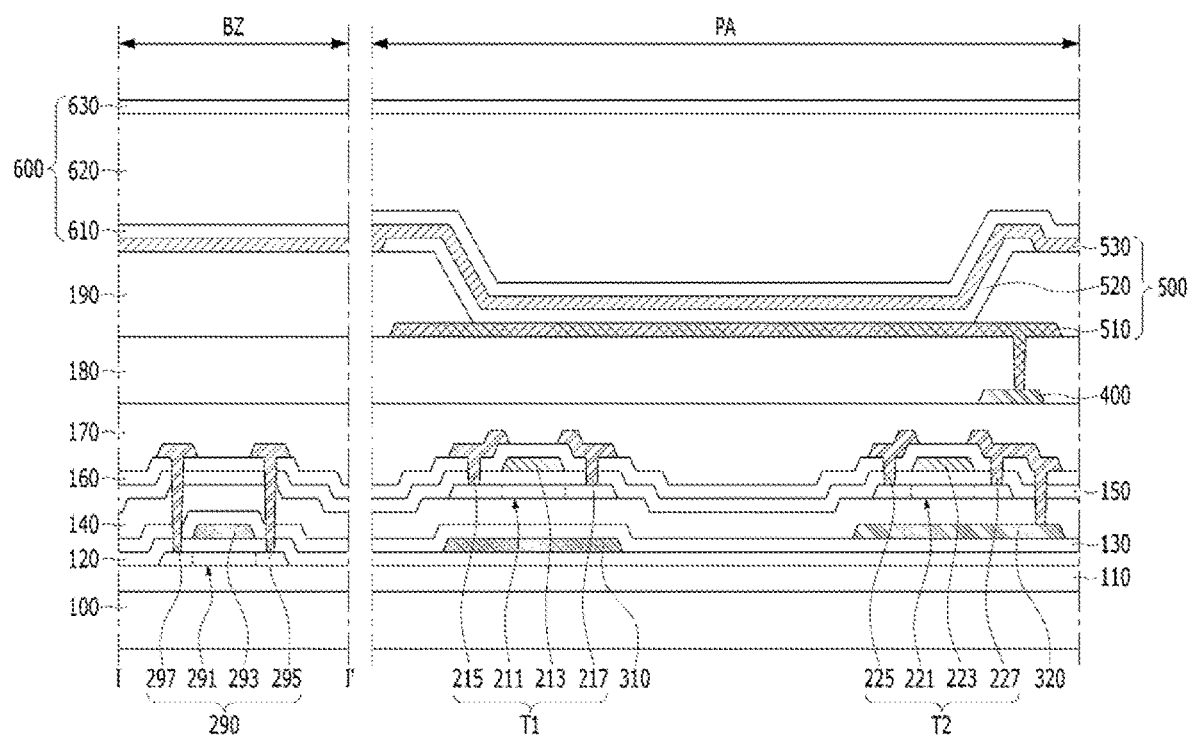
FIG. 4 is a view schematically showing a cross-section taken along line I-I' in FIG. 1 and a cross-section of each pixel area.
Figure 5:
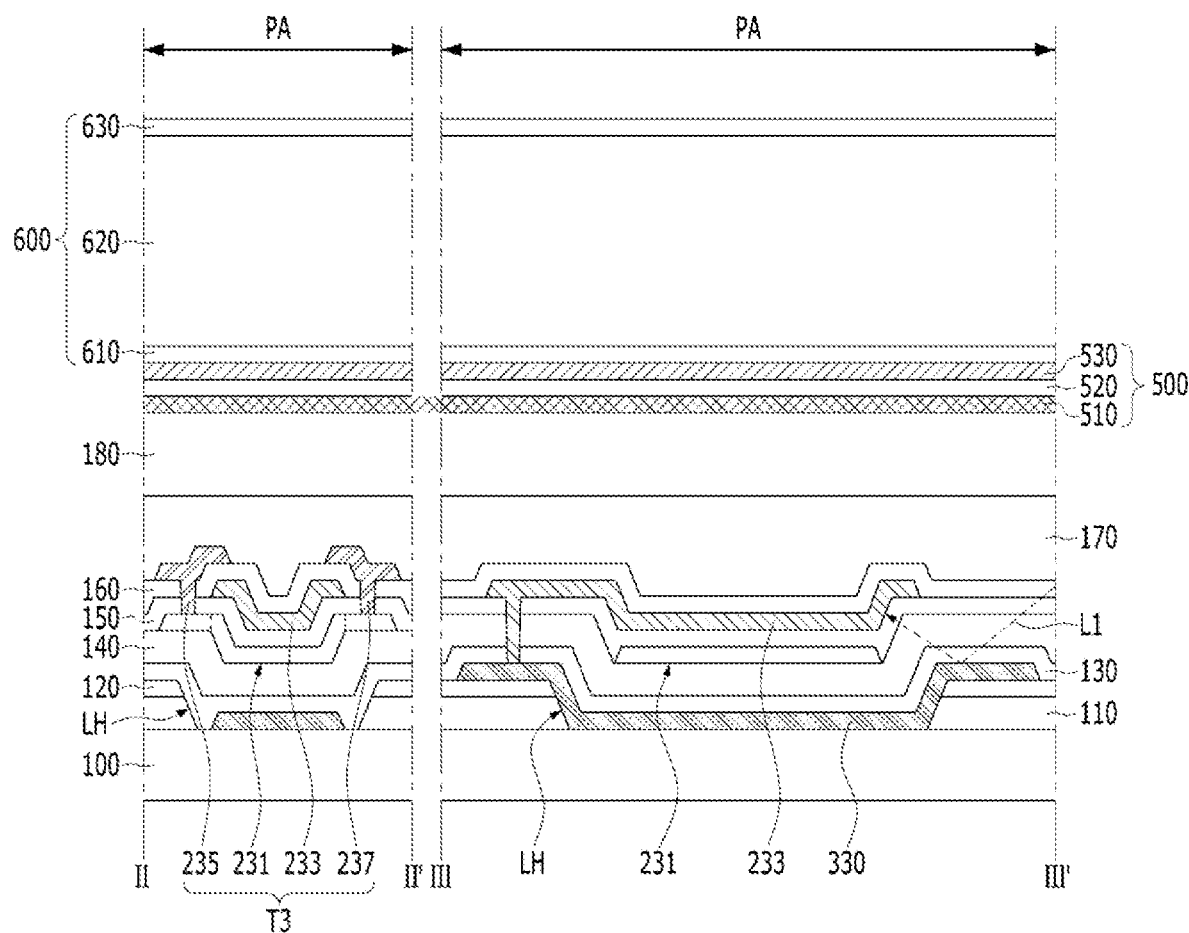
FIG. 5 is a view showing cross-sections taken along lines II-II' and III-III' in FIG. 3.

FIG. 3 is a view schematically showing a layout of the third thin film transistor T3 disposed in each pixel area PA in the display apparatus according to the embodiment of the present disclosure. FIG. 4 is a view schematically showing a cross-section taken along line I-I' in FIG. 1 and a cross-section of each pixel area PA. FIG. 5 is a view showing cross-sections taken along lines II-II' and III-III' in FIG. 3.

Referring to FIGS. 1 to 5, in each pixel driving circuit DC of the display apparatus according to the embodiment of the present disclosure, the first thin film transistor T1 may be electrically connected between a data line DL and a third node N3. For example, the first thin film transistor T1 may electrically connect the third node N3 to the data line DL in accordance with a second gate signal applied thereto through a second gate line GL2. The first thin film transistor T1 is turned on by the second gate signal and, as such, may transmit, to the third node N3, a data signal applied thereto through the data line DL. For example, the first thin film transistor T1 may be a switching thin film transistor.

The first thin film transistor T1 may include a first semiconductor pattern 211, a first gate electrode 213, a first drain electrode 215, and a first source electrode 217. For example, the first gate electrode 213 of the first thin film transistor T1 may be electrically connected to the second gate line GL2, the first drain electrode 215 of the first thin film transistor T1 may be electrically connected to the data line DL, and the first source electrode 217 of the first thin film transistor T1 may be electrically connected to the third node N3.

The first semiconductor pattern 211 may include a semiconductor material. For example, the first semiconductor pattern 211 may include an oxide semiconductor such as IGZO. The first semiconductor pattern 211 may include a first channel region, a first drain region, and a first source region. The first channel region may be disposed between the first drain region and the first source region. The resistance of the first drain region and the resistance of the first source region may be smaller than the resistance of the first channel region. For example, each of the first drain region and the first source region may include a region, treated to have conductivity, of an oxide semiconductor. The first channel region may be a region, not treated to have conductivity, of an oxide semiconductor.

The first gate electrode 213 may include a conductive material. For example, the first gate electrode 213 may include a metal such as aluminum (Al), chromium (Cr), copper (Cu), molybdenum (Mo), titanium (Ti), and tungsten (W). The first gate electrode 213 may be disposed on the first semiconductor pattern 211. For example, the first gate electrode 213 may overlap with the first channel region of the first semiconductor pattern 211. The first drain region and the first source region of the first semiconductor pattern 211 may be disposed outside the first gate electrode 213. The first gate electrode 213 may be insulated from the first semiconductor pattern 211. For example, the first source region may be electrically connected to the first drain region by a signal applied to the first gate electrode 213.

The first drain electrode 215 may include a conductive material. For example, the first drain electrode 215 may include a metal such as aluminum (Al), chromium (Cr), copper (Cu), molybdenum (Mo), titanium (Ti), and tungsten (W). The first drain electrode 215 may include a material different from that of the first gate electrode 213. The first drain electrode 215 may be disposed on a layer different from that of the first gate electrode 213. For example, the first drain electrode 215 may be insulated from the first gate electrode 213. The first drain electrode 215 may be electrically connected to the first drain region of the first semiconductor pattern 211.

The first source electrode 217 may include a conductive material. For example, the first source electrode 217 may include a metal such as aluminum (Al), chromium (Cr), copper (Cu), molybdenum (Mo), titanium (Ti), and tungsten (W). The first source electrode 217 may include a material different from that of the first gate electrode 213. The first source electrode 217 may be disposed on a layer different from that of the first gate electrode 213. For example, the first source electrode 217 may be disposed on the same layer as the first drain electrode 215. The first source electrode 217 may include the same material as that of the first drain electrode 215. The first source electrode 217 may be insulated from the first gate electrode 213. For example, the first source electrode 217 may be electrically connected to the first source region of the first semiconductor pattern 211.

In each pixel driving circuit DC of the display apparatus according to the embodiment of the present disclosure, the second thin film transistor T2 may be electrically connected between a second node N2 and the third node N3. The second thin film transistor T2 may include a second semiconductor pattern 221, a second gate electrode 223, a second drain electrode 225, and a second source electrode 227. For example, the second gate electrode 223 may be electrically connected to a first node N1, the second drain electrode 225 may be electrically connected to the third node N3, and the second source electrode 227 may be electrically connected to the second node N2. The second thin film transistor T2 may generate drive current corresponding to a data signal applied to the third node N3. For example, the second thin film transistor T2 may be a driving thin film transistor.

The second semiconductor pattern 221 may include a semiconductor material. For example, the second semiconductor pattern 221 may include an oxide semiconductor such as IGZO. The second semiconductor pattern 221 may include a second channel region disposed between a second drain region and a second source region. The second channel region may have a greater resistance than those of the second drain region and the second source region. For example, each of the second drain region and the second source region may include a region, treated to have conductivity, of an oxide semiconductor, and the second channel region may be a region, not treated to have conductivity, of an oxide semiconductor.

The second semiconductor pattern 221 may be disposed on the same layer as the first semiconductor pattern 211. The second semiconductor pattern 221 may include the same material as that of the first semiconductor pattern 211. For example, the second semiconductor pattern 221 may be formed concurrently (or in some cases, simultaneously) with the first semiconductor pattern 211. The second drain region and the second source region of the second semiconductor pattern 221 may have the same resistance as that of the first drain region and the first source region. For example, the resistance of the second channel region may be equal to the resistance of the first channel region.

The second gate electrode 223 may include a conductive material. For example, the second gate electrode 223 may include a metal such as aluminum (Al), chromium (Cr), copper (Cu), molybdenum (Mo), titanium (Ti), and tungsten (W). The second gate electrode 223 may include the same material as that of the first gate electrode 213. The second gate electrode 223 may be disposed on the same layer as the first gate electrode 213. For example, the second gate electrode 223 may be formed concurrently (or in some cases, simultaneously) with the first gate electrode 213.

The second gate electrode 223 may be disposed on the second semiconductor pattern 221. For example, the second gate electrode 223 may overlap with the second channel region of the second semiconductor pattern 221. The second drain region and the second source region of the second semiconductor pattern 221 may be disposed outside the second gate electrode 223. The second gate electrode 223 may be insulated from the second semiconductor pattern 221. For example, the second channel region of the second semiconductor pattern 221 may have electrical conductivity corresponding to a voltage applied to the second gate electrode 223.

The second drain electrode 225 may include a conductive material. For example, the second drain electrode 225 may include a metal such as aluminum (Al), chromium (Cr), copper (Cu), molybdenum (Mo), titanium (Ti), and tungsten (W). The second drain electrode 225 may include a material different from that of the second gate electrode 223. The second drain electrode 225 may be disposed on a layer different from that of the second gate electrode 223. For example, the second drain electrode 225 may be insulated from the second gate electrode 223. The second drain electrode 225 may be electrically connected to the second drain region of the second semiconductor pattern 221.

The second drain electrode 225 may be disposed on the same layer as the first drain electrode 215. The second drain electrode 225 may include the same material as that of the first drain electrode 215. For example, the second drain electrode 225 may be formed concurrently (or in some cases, simultaneously) with the first drain electrode 215.

The second source electrode 227 may include a conductive material. For example, the second source electrode 227 may include a metal such as aluminum (Al), chromium (Cr), copper (Cu), molybdenum (Mo), titanium (Ti), and tungsten (W). The second source electrode 227 may include a material different from that of the second gate electrode 223. The second source electrode 227 may be disposed on a layer different from that of the second gate electrode 223. For example, the second source electrode 227 may be insulated from the second gate electrode 223. The second source electrode 227 may be electrically connected to the second source region of the second semiconductor pattern 221.

The second source electrode 227 may be disposed on the same layer as the first source electrode 217. The second source electrode 227 may include the same material as that of the first source electrode 217. For example, the second source electrode 227 may be formed concurrently (or in some cases, simultaneously) with the first source electrode 217.

In each pixel driving circuit DC of the display apparatus according to the embodiment of the present disclosure, the third thin film transistor T3 may be electrically connected between the first node N1 and the second node N2. For example, the third thin film transistor T3 may electrically connect the second node N2 to the first node N1 in accordance with a first gate signal applied thereto through a first gate line GL1. The third thin film transistor T3 may be a switching thin film transistor. The third thin film transistor T3 may have the same structure as that of the first thin film transistor T1. For example, the third thin film transistor T3 may include a third semiconductor pattern 231, a third gate electrode 233, a third drain electrode 235, and a third source electrode 237. The third gate electrode 233 may be electrically connected to the first gate line GL1, the third drain electrode 235 may be electrically connected to the first node N1, and the third source electrode 237 may be electrically connected to the second node N2.

The second thin film transistor T2 may be switched to a diode connection state in accordance with turn-on of the third thin film transistor T3. For example, the third thin film transistor T3 may be a sampling thin film transistor electrically connected between the second gate electrode 223 and the second source electrode 227 of the second thin film transistor T2 which is a driving thin film transistor.

The third semiconductor pattern 231 may include a semiconductor material. For example, the third semiconductor pattern 231 may include an oxide semiconductor such as IGZO. The third semiconductor pattern 231 may include a third channel region, a third drain region, and a third source region. The third channel region may be disposed between the third drain region and the third source region. The resistance of the third drain region and the resistance of the third source region may be smaller than the resistance of the third channel region. For example, each of the third drain region and the third source region may include a region, treated to have conductivity, of an oxide semiconductor, and the third channel region may be a region, not treated to have conductivity, of an oxide semiconductor.

The third semiconductor pattern 231 may be disposed on the same layer as the first semiconductor pattern 211. The third semiconductor pattern 231 may include the same material as that of the first semiconductor pattern 211. For example, the third semiconductor pattern 231 may be formed concurrently (or in some cases, simultaneously) with the first semiconductor pattern 211. The third drain region and the third source region of the third semiconductor pattern 231 may have the same resistance as that of the first drain region and the first source region of the first semiconductor pattern 211. For example, the resistance of the third channel region may be equal to the resistance of the first channel region.

The third gate electrode 233 may include a conductive material. For example, the third gate electrode 233 may include a metal such as aluminum (Al), chromium (Cr), copper (Cu), molybdenum (Mo), titanium (Ti), and tungsten (W). The third gate electrode 233 may include the same material as that of the first gate electrode 213. The third gate electrode 233 may be disposed on the same layer as the first gate electrode 213. For example, the third gate electrode 233 may be formed concurrently (or in some cases, simultaneously) with the first gate electrode 213.

The third gate electrode 233 may be disposed on the third semiconductor pattern 231. For example, the third gate electrode 233 may overlap with the third channel region of the third semiconductor pattern 231. The third drain region and the third source region of the third semiconductor pattern 231 may be disposed outside the third gate electrode 233. The third gate electrode 233 may be insulated from the third semiconductor pattern 231. For example, the third source region may be electrically connected to the third drain region in accordance with a signal applied to the third gate electrode 233.

The third drain electrode 235 may include a conductive material. For example, the third drain electrode 235 may include a metal such as aluminum (Al), chromium (Cr), copper (Cu), molybdenum (Mo), titanium (Ti), and tungsten (W). The third drain electrode 235 may include a material different from that of the third gate electrode 233. The third drain electrode 235 may be disposed on a layer different from that of the third gate electrode 233. For example, the third drain electrode 235 may be insulated from the third gate electrode 233. The third drain electrode 235 may be electrically connected to the third drain region of the third semiconductor pattern 231.

The third drain electrode 235 may be disposed on the same layer as the first drain electrode 215. The third drain electrode 225 may include the same material as that of the first drain electrode 215. For example, the third drain electrode 225 may be formed concurrently (or in some cases, simultaneously) with the first drain electrode 215.

The third source electrode 237 may include a conductive material. For example, the third source electrode 237 may include a metal such as aluminum (Al), chromium (Cr), copper (Cu), molybdenum (Mo), titanium (Ti), and tungsten (W). The third source electrode 237 may include a material different from that of the third gate electrode 233. The third source electrode 237 may be disposed on a layer different from that of the third gate electrode 233. For example, the third source electrode 237 may be disposed on the same layer as the third drain electrode 235. The third source electrode 237 may include the same material as that of the third drain electrode 235. The third source electrode 237 may be insulated from the third gate electrode 233. For example, the third source electrode 237 may be electrically connected to the third source region of the third semiconductor pattern 231.

The third source electrode 237 may be disposed on the same layer as the first source electrode 217. The third source electrode 237 may include the same material as that of the first source electrode 217. For example, the third source electrode 237 may be formed concurrently (or in some cases, simultaneously) with the first source electrode 217.

In each pixel driving circuit DC of the display apparatus according to the embodiment of the present disclosure, the fourth thin film transistor T4 may be electrically connected between a supply voltage supply line PL and the second node N2. For example, the fourth thin film transistor T4 may electrically connect the supply voltage supply line PL to the second node N2 in accordance with a first emission signal applied thereto through a first emission control line EM1. The fourth thin film transistor T4 may be turned on in accordance with the first emission signal, thereby supplying, to the second node N2, a positive supply voltage VDD applied thereto through the supply voltage supply line PL. For example, the fourth thin film transistor T4 may be a switching thin film transistor.

The fourth thin film transistor T4 may have the same structure as that of the first thin film transistor T1. For example, the fourth thin film transistor T4 may include a fourth semiconductor pattern, a fourth gate electrode, a fourth drain electrode, and a fourth source electrode. The fourth gate electrode may be electrically connected to the first emission control line EM1, the fourth drain electrode may be electrically connected to the second node N2, and the fourth source electrode may be electrically connected to the supply voltage supply line PL.

The fourth thin film transistor T4 may be formed concurrently (or in some cases, simultaneously) with the first thin film transistor T1. For example, the fourth semiconductor pattern may be disposed on the same layer as the first semiconductor pattern 211, the fourth gate electrode may be disposed on the same layer as the first gate electrode 213, and the fourth drain electrode and the fourth source electrode may be disposed on the same layer as the first drain electrode 215 and the first source electrode 217. The fourth semiconductor pattern may include the same material as that of the first semiconductor pattern 211, the fourth gate electrode may include the same material as that of the first gate electrode 213, and the fourth drain electrode and the fourth source electrode may include the same material as that of the first drain electrode 215 and the first source electrode 217.

In each pixel driving circuit DC of the display apparatus according to the embodiment of the present disclosure, the fifth thin film transistor T5 may be electrically connected between the third node N3 and a fifth node N5. For example, the fifth thin film transistor T5 may electrically connect the third node N3 to the fifth node N5 in accordance with a second emission signal applied thereto through a second emission control line EM2. The fifth thin film transistor T5 may be turned on in accordance with the second emission signal, thereby supplying, to the fifth node N5, the drive current generated by the second thin film transistor T2. For example, the fifth thin film transistor T5 may be a switching thin film transistor.

The fifth thin film transistor T5 may have the same structure as that of the first thin film transistor T1. For example, the fifth thin film transistor T5 may include a fifth semiconductor pattern, a fifth gate electrode, a fifth drain electrode, and a fifth source electrode. The fifth gate electrode may be electrically connected to the second emission control line EM2, the fifth drain electrode may be electrically connected to the fifth node N5, and the fifth source electrode may be electrically connected to the third node N3.

The fifth thin film transistor T5 may be formed concurrently (or in some cases, simultaneously) with the first thin film transistor T1. For example, the fifth semiconductor pattern may be disposed on the same layer as the first semiconductor pattern 211, the fifth gate electrode may be disposed on the same layer as the first gate electrode 213, and the fifth drain electrode and the fifth source electrode may be disposed on the same layer as the first drain electrode 215 and the first source electrode 217. The fifth semiconductor pattern may include the same material as that of the first semiconductor pattern 211, the fifth gate electrode may include the same material as that of the first gate electrode 213, and the fifth drain electrode and the fifth source electrode may include the same material as that of the first drain electrode 215 and the first source electrode 217.

In each pixel driving circuit DC of the display apparatus according to the embodiment of the present disclosure, the sixth thin film transistor T6 may be electrically connected between a reference voltage supply line RL and a fourth node N4. The sixth thin film transistor T6 may have the same structure as that of the first thin film transistor T1. For example, the sixth thin film transistor T6 may include a sixth semiconductor pattern, a sixth gate electrode, a sixth drain electrode, and a sixth source electrode. The sixth thin film transistor T6 may be turned on/off concurrently (or in some cases, simultaneously) with the third thin film transistor T3. For example, the sixth gate electrode may be electrically connected to the first gate line GL1, the sixth drain electrode may be electrically connected to the fourth node N4, and the sixth source electrode may be electrically connected to the reference voltage supply line RL. The sixth thin film transistor T6 may electrically connect the reference voltage supply line RL to the fourth node N4 in accordance with the first gate signal. For example, the sixth thin film transistor T6 may be turned on by the first gate signal, thereby transmitting, to the fourth node N4, a reference voltage applied thereto through the reference voltage supply line RL. The sixth thin film transistor T6 may be a switching thin film transistor.

The fourth thin film transistor T4 may be turned on by a signal applied thereto through the first emission control line EM1, thereby supplying, to the second node N2, the positive supply voltage VDD applied thereto through the supply voltage supply line PL. The fifth thin film transistor T5 may be turned on by a signal applied thereto through the second emission control line EM2, thereby supplying, to the fifth node N5, the drive current generated by the second thin film transistor T2. The sixth thin film transistor T6 may be turned on by a signal applied thereto through the first gate line GL1, thereby supplying, to the fourth node N4, the reference voltage applied thereto through the reference voltage supply line RL. For example, the sixth thin film transistor T6 may be turned on/off concurrently (or in some cases, simultaneously) with the third thin film transistor T3.

The sixth thin film transistor T6 may be formed concurrently (or in some cases, simultaneously) with the first thin film transistor T1. For example, the sixth semiconductor pattern may be disposed on the same layer as the first semiconductor pattern 211, the sixth gate electrode may be disposed on the same layer as the first gate electrode 213, and the sixth drain electrode and the sixth source electrode may be disposed on the same layer as the first drain electrode 215 and the first source electrode 217. The sixth semiconductor pattern may include the same material as that of the first semiconductor pattern 211, the sixth gate electrode may include the same material as that of the first gate electrode 213, and the sixth drain electrode and the sixth source electrode may include the same material as that of the first drain electrode 215 and the first source electrode 217.

In each pixel driving circuit DC of the display apparatus according to the embodiment of the present disclosure, the storage capacitor Cst may be electrically connected between the first node N1 and the fourth node N4. For example, a signal applied to the second gate electrode 223 of the second thin film transistor T2 may be maintained for one frame by the storage capacitor Cst. The fourth node N4 may be electrically connected to the fifth node N5. For example, the storage capacitor Cst may be electrically connected between the second gate electrode 223 of the second thin film transistor T2 and the fifth drain electrode of the fifth thin film transistor T5.

The storage capacitor Cst may have a stack structure of capacitor electrodes. The storage capacitor Cst may be formed using formation processes for the thin film transistors T1, T2, T3, T4, T5, and T6. For example, the storage capacitor Cst may include a first capacitor electrode formed concurrently (or in some cases, simultaneously) with the second gate electrode 223, and a second capacitor electrode formed concurrently (or in some cases, simultaneously) with the second drain electrode 225. The first capacitor electrode may include the same material as that of the second gate electrode 223. The first capacitor electrode may be disposed on the same layer as the second gate electrode 223. The second capacitor electrode may include the same material as that of the second drain electrode 225. The second capacitor electrode may be disposed on the same layer as the second drain electrode 225.

In the display apparatus according to the embodiment of the present disclosure, one frame may include an initialization period, a sampling period, and an emission period. In the initialization period, only the third thin film transistor T3, the fourth thin film transistor T4, and the sixth thin film transistor T6 may be turned on and, as such, the positive supply voltage VDD may be applied to the first node N1 and the second node N2, and the reference voltage may be applied to the fourth node N4. That is, in the display apparatus according to the embodiment of the present disclosure, the storage capacitor Cst may be initialized during the initialization period.

In the sampling period, only the first thin film transistor T1, the third thin film transistor T3, and the sixth thin film transistor T6 may be turned on and, as such, the second thin film transistor T2 may be switched to a diode connection state, and the data signal may be applied to the third node N3. The voltage of the data signal may be lower than a value obtained by deducting a threshold voltage Vth of the second thin film transistor T2 from the positive supply voltage VDD. In the display apparatus according to the embodiment of the present disclosure, accordingly, the first node N1 may have a potential equal to a value obtained by summing the threshold voltage Vth of the second thin film transistor T2 and the data signal during the sampling period. In the display apparatus according to the embodiment of the present disclosure, accordingly, during the sampling period, the second thin film transistor T2 may be turned on and, as such, current may flow between the second drain electrode 225 and the second source electrode 227 of the second thin film transistor T2. That is, in the display apparatus according to the embodiment of the present disclosure, drive current corresponding to the data signal may be generated by the second thin film transistor T2 during the sampling period. In addition, in the display apparatus according to the embodiment of the present disclosure, a voltage value corresponding to the data signal may be stored in the storage capacitor Cst during the sampling period.

In the emission period, only the fourth thin film transistor T4 and the fifth thin film transistor T5 are turned on and, as such, the positive supply voltage VDD may be applied to the second node N2, and the third node N3 may be electrically connected to the fifth node N5. In the display apparatus according to the embodiment of the present disclosure, accordingly, the drive current generated by the second thin film transistor T2 may be supplied to the fifth node N5 during the emission period.

The pixel driving circuit DC of each pixel area PA may be disposed on a device substrate 100. The device substrate 100 may include an insulating material. For example, the device substrate 100 may include glass or plastic.

The display panel DP may include an active area AA where the pixel areas PA are disposed, and a bezel area BZ disposed outside the active area AA. At least one of the gate driver GD, the data driver DD, the power unit PU or the timing controller TC may be disposed on the bezel area BZ. For example, the display apparatus according to the embodiment of the present disclosure may be a gate-in-panel type display apparatus in which the gate driver GD is formed on the bezel area BZ of the display panel DP. The gate driver GD may include at least one circuit thin film transistor 290 disposed on the bezel area BZ of the device substrate 100.

The circuit thin film transistor 290 may selectively rapidly transmit a particular signal. For example, the circuit thin film transistor 290 may be a switching thin film transistor. The circuit thin film transistor 290 may have the same structure as that of the first thin film transistor T1. For example, the circuit thin film transistor 290 may include a circuit semiconductor pattern 291, a circuit gate electrode 293, a circuit drain electrode 295, and a circuit source electrode 297.

The circuit semiconductor pattern 291 may include a semiconductor material. The circuit semiconductor pattern 291 may include a material different from that of the first semiconductor pattern 211 of each pixel area PA. For example, the circuit semiconductor pattern 291 may include low-temperature poly-Si (LTPS). The circuit semiconductor pattern 291 may be disposed on a layer different from that of the first semiconductor pattern 211. For example, the circuit semiconductor pattern 291 may have electrical characteristics different from those of the first semiconductor pattern 211 of each pixel area PA.

The circuit semiconductor pattern 291 may include a circuit channel region, a circuit drain region, and a circuit source region. The circuit channel region may be disposed between the circuit drain region and the circuit source region. The resistance of the circuit drain region and the resistance of the circuit source region may be smaller than the resistance of the circuit channel region. For example, the circuit drain region and the circuit source region may include a conductive impurity. The circuit channel region may be a region not doped with a conductive impurity.

The circuit gate electrode 293 may include a conductive material. For example, the circuit gate electrode 293 may include a metal such as aluminum (Al), chromium (Cr), copper (Cu), molybdenum (Mo), titanium (Ti), and tungsten (W). The circuit gate electrode 293 may be disposed on the circuit semiconductor pattern 291. For example, the circuit gate electrode 293 may overlap with the circuit channel region of the circuit semiconductor pattern 291. The circuit drain region and the circuit source region of the circuit semiconductor pattern 291 may be disposed outside the circuit gate electrode 293. The circuit gate electrode 293 may be insulated from the circuit semiconductor pattern 291. For example, the circuit source region may be electrically connected to the circuit drain region by a signal applied to the circuit gate electrode 293.

The circuit gate electrode 293 may be disposed on a layer different from that of the first gate electrode 213. For example, the circuit gate electrode 293 may include a material different from that of the first gate electrode 213 of each pixel area PA. The circuit gate electrode 293 may be formed by a process different from that of the first gate electrode 213 of each pixel area PA.

The circuit drain electrode 295 may include a conductive material. For example, the circuit drain electrode 295 may include a metal such as aluminum (Al), chromium (Cr), copper (Cu), molybdenum (Mo), titanium (Ti), and tungsten (W). The circuit drain electrode 295 may include a material different from that of the circuit gate electrode 293. The circuit drain electrode 295 may be disposed on a layer different from that of the circuit gate electrode 293. For example, the circuit drain electrode 295 may be insulated from the circuit gate electrode 293. The circuit drain electrode 295 may be electrically connected to the circuit drain region of the circuit semiconductor pattern 291.

The circuit drain electrode 295 may be disposed on the same layer as the first drain electrode 215 of each pixel area PA. The circuit drain electrode 295 may include the same material as that of the first drain electrode 215 of each pixel area PA. For example, the circuit drain electrode 295 may be formed concurrently (or in some cases, simultaneously) with the first drain electrode 215 of each pixel area PA.

The circuit source electrode 297 may include a conductive material. For example, the circuit source electrode 297 may include a metal such as aluminum (Al), chromium (Cr), copper (Cu), molybdenum (Mo), titanium (Ti), and tungsten (W). The circuit source electrode 297 may include a material different from that of the circuit gate electrode 293. The circuit source electrode 297 may be disposed on a layer different from that of the circuit gate electrode 293. For example, the circuit source electrode 297 may be disposed on the same layer as the circuit drain electrode 295. The circuit source electrode 297 may include the same material as that of the circuit drain electrode 295. The circuit source electrode 297 may be insulated from the circuit gate electrode 293. For example, the circuit source electrode 297 may be electrically connected to the circuit source region of the circuit semiconductor pattern 291.

The circuit source electrode 297 may be disposed on the same layer as the first source electrode 217 of each pixel area PA. The circuit source electrode 297 may include the same material as that of the first source electrode 217. For example, the circuit source electrode 297 may be formed concurrently (or in some cases, simultaneously) with the first source electrode 217 of each pixel area PA.

A plurality of insulating layers 110, 120, 130, 140, 150, 160, 170, 180, and 190 configured to prevent unnecessary electrical connection in the display panel DP may be disposed on the device substrate 100. For example, a lower buffer layer 110, a lower gate insulating layer 120, a lower interlayer insulating layer 130, an upper buffer layer 140, an upper gate insulating layer 150, an upper interlayer insulating layer 160, a first planarization layer 170, a second planarization layer 180, and a bank insulating layer 190 may be disposed on the device substrate 100.

The lower buffer layer 110 may be disposed near the device substrate 100. The lower buffer layer 110 may prevent contamination caused by the device substrate 100 in a process of forming the circuit thin film transistor 290 and the pixel driving circuit DC of each pixel area PA. For example, the lower buffer layer 110 may completely cover the active area AA and the bezel area BZ of the device substrate 100. The circuit thin film transistor 290 and the pixel driving circuit DC of each pixel area PA may be disposed on the lower buffer layer 110. The lower buffer layer 110 may include an insulating material. For example, the lower buffer layer 110 may include an inorganic insulating material such as silicon oxide ($SiO_x$) or silicon nitride ($SiN_x$). The lower buffer layer 110 may have a multilayer structure. For example, the lower buffer layer 110 may have a stack structure constituted by an inorganic insulating layer made of silicon oxide ($SiO_x$) and an inorganic insulating layer made of silicon nitride ($SiN_x$).

The lower gate insulating layer 120 may insulate the circuit semiconductor pattern 291 and the circuit gate electrode 293 of the circuit thin film transistor 290 from each other. For example, the circuit semiconductor pattern 291 may be disposed between the lower buffer layer 110 and the lower gate insulating layer 120. The lower gate insulating layer 120 may cover the circuit semiconductor pattern 291. The lower gate insulating layer 120 may extend onto the active area AA of the device substrate 100. For example, the thin film transistors T1, T2, T3, T4, T5, and T6 of each pixel area PA may be disposed on the lower gate insulating layer 120. The lower gate insulating layer 120 may include an insulating material. For example, the lower gate insulating layer 120 may include an inorganic insulating material such as silicon oxide ($SiO_x$) or silicon nitride ($SiN_x$).

The lower interlayer insulating layer 130 may insulate the circuit drain electrode 295 and the circuit source electrode 297 from the circuit gate electrode 291. For example, the circuit gate electrode 291 may be disposed between the lower gate insulating layer 120 and the lower interlayer insulating layer 130, and the circuit drain electrode 295 and the circuit source electrode 297 may be disposed on the lower interlayer insulating layer 130. The lower interlayer insulating layer 130 may extend onto the active area AA of the device substrate 100. For example, the thin film transistors T1, T2, T3, T4, T5, and T6 of each pixel area PA may be disposed on the lower interlayer insulating layer 130. The lower interlayer insulating layer 130 may include an insulating material. For example, the lower interlayer insulating layer 130 may include an inorganic insulating material such as silicon oxide ($SiO_x$) or silicon nitride ($SiN_x$).

The upper buffer layer 140 may be disposed between the lower interlayer insulating layer 130 and the thin film transistors T1, T2, T3, T4, T5, and T6 of each pixel area PA. For example, the semiconductor patterns 211, 221, and 231 of each pixel area PA may be disposed on the upper buffer layer 140. In the display apparatus according to the embodiment of the present disclosure, accordingly, damage to the semiconductor patterns 211, 221, 231 disposed in each pixel area PA, which is caused by formation processes for the circuit semiconductor pattern 291 and the circuit gate electrode 293, may be prevented. For example, the thickness of the upper buffer layer 140 may be greater than the thickness of the lower interlayer insulating layer 130. The upper buffer layer 140 may include an insulating material. The upper buffer layer 140 may include a material having a relatively low hydrogen content. For example, the upper buffer layer 140 may be an inorganic insulating layer made of silicon oxide ($SiO_x$). In the display apparatus according to the embodiment of the present disclosure, accordingly, a variation in characteristics of the semiconductor patterns 211, 221, and 231 disposed in each pixel area PA, which is caused by diffusion of hydrogen, may be prevented. That is, in the display apparatus according to the embodiment of the present disclosure, degradation of characteristics of each pixel driving circuit DC caused by hydrogen may be prevented.

The upper gate insulating layer 150 may insulate the semiconductor patterns 211, 221, and 231 and the gate electrodes 213, 223, 233 in each pixel area PA from each other. For example, the first semiconductor pattern 211, the second semiconductor pattern 221, the third semiconductor pattern 231, the fourth semiconductor pattern, the fifth semiconductor pattern, and the sixth semiconductor pattern of each pixel area PA may be disposed between the upper buffer layer 140 and the upper gate insulating layer 150. The upper gate insulating layer 150 may cover the first semiconductor pattern 211, the second semiconductor pattern 221, the third semiconductor pattern 231, the fourth semiconductor pattern, the fifth semiconductor pattern, and the sixth semiconductor pattern of each pixel area PA. For example, the first gate electrode 213, the second gate electrode 223, the third gate electrode 233, the fourth gate electrode, the fifth gate electrode, and the sixth gate electrode of each pixel area PA may be disposed on the upper gate insulating layer 150. The upper gate insulating layer 150 may extend onto the bezel area BZ of the device substrate 100. For example, the circuit drain electrode 295 and the circuit source electrode 297 may be disposed on the upper gate insulating layer 150 of the bezel area BZ. The upper gate insulating layer 150 may include an insulating material. For example, the upper gate insulating layer 150 may be an inorganic insulating layer made of silicon oxide ($SiO_x$).

Distances between corresponding ones of the semiconductor patterns 211, 221, and 231 and the gate electrodes 213, 223, and 233 may be equal. For example, the upper gate insulating layer 150 may directly contact the semiconductor patterns 211, 221, and 231 and the gate electrodes 213, 223, and 233 of each pixel area PA. In the display apparatus according to the embodiment of the present disclosure, accordingly, the formation process for the pixel driving circuit DC disposed in each pixel area PA may be simplified.

The upper interlayer insulating layer 160 may insulate the drain electrodes 215, 225, and 235 and the source electrodes 217, 227, and 237 disposed in each pixel area PA from corresponding ones of the gate electrodes 213, 223, and 233 disposed in each pixel area PA. For example, the gate electrodes 213, 223, and 233 of each pixel area PA may be disposed between the upper gate insulating layer 150 and the upper interlayer insulating layer 160, and the drain electrodes 215, 225, and 235 and the source electrodes 217, 227, and 237 of each pixel area PA may be disposed on the upper interlayer insulating layer 160. The drain electrodes 215, 225, and 235 and the source electrodes 217, 227, and 237 of each pixel area PA may be electrically connected to corresponding ones of the semiconductor patterns 211, 221, and 231, respectively, while extending through the upper gate insulating layer 150 and the upper interlayer insulating layer 160. The upper interlayer insulating layer 160 may extend onto the bezel area BZ of the device substrate 100. For example, the circuit drain electrode 295 and the circuit source electrode 297 may be disposed on the upper interlayer insulating layer 160. The circuit drain electrode 295 and the circuit source electrode 297 may be electrically connected to the circuit semiconductor pattern 291 while extending through the lower gate insulating layer 120, the lower interlayer insulating layer 130, the upper buffer layer 140, the upper gate insulating layer 150, and the upper interlayer insulating layer 160.

The upper interlayer insulating layer 160 may include an insulating material. The upper interlayer insulating layer 160 may include a material different from that of the lower interlayer insulating layer 130. The upper interlayer insulating layer 160 may include a material having a relatively low hydrogen content. For example, the upper interlayer insulating layer 160 may be an inorganic insulating layer made of silicon oxide ($SiO_x$). In the display apparatus according to the embodiment of the present disclosure, accordingly, a variation in characteristics of the thin film transistors T1, T2, T3, T4, T5, and T6 disposed in each pixel area PA, which is caused by hydrogen, may be prevented.

The first planarization layer 170 may be disposed on the upper interlayer insulating layer 160. For example, the drain electrodes 215, 225, and 235 and the source electrodes 217, 227, and 237 of each pixel area PA may be covered by the first planarization layer 170. The circuit drain electrode 295 and the circuit drain electrode 297 may be disposed between the upper interlayer insulating layer 160 and the first planarization layer 170. The second planarization layer 180 may be disposed on the first planarization layer 170. The first planarization layer 170 and the second planarization layer 180 may remove a step formed by the circuit thin film transistor 290 and the pixel driving circuit DC of each pixel area PA. For example, an upper surface of the second planarization layer 180 opposite to the device substrate 100 may be a flat surface.

The first planarization layer 170 and the second planarization layer 180 may include an insulating material. The first planarization layer 170 and the second planarization layer 180 may include a material different from that of the upper interlayer insulating layer 160. For example, each of the first planarization layer 170 and the second planarization layer 180 may be an organic insulating layer made of an organic insulating material. The second planarization layer 180 may include the same material as that of the first planarization layer 170. The second planarization layer 180 may directly contact the first planarization layer 170. For example, a boundary surface between the first planarization layer 170 and the second planarization layer 180 may not be recognized.

The light emitting device 500 of each pixel area PA may be disposed on the second planarization layer 180. The light emitting device 500 of each pixel area PA may emit light representing a particular color. For example, the light emitting device 500 of each pixel area PA may include a first electrode 510, an emission layer 520, and a second electrode 530 sequentially stacked on the second planarization layer 180 of the pixel area PA.

The first electrode 510 may include a conductive material. The first electrode 510 may include a material having high reflectivity. For example, the first electrode 510 may include a metal such as aluminum (Al) or silver (Ag). The first electrode 510 may have a multilayer structure. For example, the first electrode 510 may have a structure in which a reflective electrode made of a metal is disposed between transparent electrodes made of a transparent conductive material such as ITO or IZO.

The emission layer 520 may generate light having a luminance corresponding to a voltage difference between the first electrode 510 and the second electrode 530. For example, the emission layer 520 may include an emission material layer (EML) including an emission material. The emission material may include an organic material, an inorganic material, or a hybrid material. For example, the display apparatus according to the embodiment of the present disclosure may be an organic light emitting display apparatus including an organic emission material.

The emission layer 520 may have a multilayer structure. For example, the emission layer 520 may further include at least one of a hole injection layer (HIL), a hole transport layer (HTL), an electron transport layer (ETL), or an electron injection layer (EIL). In the display apparatus according to the embodiment of the present disclosure, accordingly, the emission efficiency of the emission layer 520 may be enhanced.

The second electrode 530 may include a conductive material. The second electrode 530 may include a material different from that of the first electrode 510. The transmittance of the second electrode 530 may be greater than the transmittance of the first electrode 510. For example, the second electrode 530 may be a transparent electrode made of a transparent conductive material such as ITO or IZO. In the display apparatus according to the embodiment of the present disclosure, accordingly, light generated by the emission layer 520 may be outwardly emitted through the second electrode 530.

The first electrode 510 of each pixel area PA may directly contact the upper surface of the second planarization layer 180. In the display apparatus according to the embodiment of the present disclosure, accordingly, luminance deviation according to different generation positions of light emitted from respective light emitting devices 500 may be avoided.

The first electrode 510 of each light emitting device 500 may be electrically connected to the pixel driving circuit DC of the pixel area PA corresponding thereto. For example, the first electrode 500 of each pixel area PA may be electrically connected to the fifth node N5 of the pixel driving circuit DC disposed in the pixel area PA. In the display apparatus according to the embodiment of the present disclosure, accordingly, the drive current generated by the pixel driving circuit DC of each pixel area PA may be supplied to the light emitting device 500 of the pixel area PA for one frame.

Intermediate electrodes 400 may be disposed between the first planarization layer 170 and the second planarization layer 180. The intermediate electrodes 140 may include a conductive material. For example, the intermediate electrodes 400 may include a metal such as aluminum (Al), chromium (Cr), copper (Cu), molybdenum (Mo), titanium (Ti), and tungsten (W). The first electrode 510 of each pixel area PA may be electrically connected to the pixel driving circuit DC of the pixel area PA via one of the intermediate electrodes 400. For example, each intermediate electrode 400 may be electrically connected to the fifth node N5 of one of the pixel areas PA while extending through the first planarization layer 170, and the first electrode 510 of each pixel area PA may directly contact one of the intermediate electrodes 400 while extending through the second planarization layer 180 of the pixel area PA. In the display apparatus according to the embodiment of the present disclosure, accordingly, the process of interconnecting the pixel driving circuit DC and the light emitting device 500 disposed in each pixel area PA may be simplified.

The bank insulating layer 190 may be disposed on the second planarization layer 180. The bank insulating layer 190 may insulate the first electrode 510 of each pixel area PA from the first electrode 510 of another pixel area PA adjacent to the former pixel area PA. For example, an edge of the first electrode 510 disposed in each pixel area PA may be covered by the bank insulating layer 190. The emission layer 520 and the second electrode 530 of each pixel area PA may be sequentially stacked on a portion of the corresponding first electrode 510 exposed by the bank insulating layer 190. For example, the bank insulating layer 190 may define an emission area in each pixel area PA. The bank insulating layer 190 may include an insulating material. For example, the bank insulating layer 190 may include an organic insulating material. The bank insulating layer 190 may include a material different from that of the second planarization layer 180.

Light emitted from the light emitting device 500 of each pixel area PA may represent a color different from that of light emitted from the light emitting device 500 of another pixel area PA adjacent to the former pixel area PA. For example, the emission layer 520 of each pixel area PA may include a material different from that of the emission layer 520 of the adjacent pixel area PA. The emission layer 520 disposed in each pixel area PA may include an end disposed on the bank insulating layer 190. The emission layer 520 of each pixel area PA may be individually formed. For example, the emission layer 520 of each pixel area PA may be formed using a fine metal mask (FMM). A spacer may be disposed on the bank insulating layer 190. The spacer may prevent damage to the bank insulating layer 190 and the emission layer 520 caused by the fine metal mask. The spacer may include an insulating material. For example, the spacer may include an organic insulating material. The spacer may include the same material as that of the bank insulating layer 190. For example, the bank insulating layer 190 and the spacer may be concurrently (or in some cases, simultaneously) formed by a patterning process using a halftone mask. The end of the emission layer 520 disposed in each pixel area PA may be spaced apart from the spacer.

A voltage applied to the second electrode 530 of each pixel area PA may be identical to a voltage applied to the second electrode 530 of the adjacent pixel area PA. For example, a negative supply voltage VSS may be applied to the second electrode 530 of each pixel area PA. The second electrode 530 of each pixel area PA may be electrically connected to the second electrode 530 of the adjacent pixel area PA. The second electrode 530 of each pixel area PA may include the same material as that of the second electrode 530 of the adjacent pixel area PA. For example, the second electrode 530 of each pixel area PA may be formed concurrently (or in some cases, simultaneously) with the second electrode 530 of the adjacent pixel area PA. The second electrode 530 of each pixel area PA may directly contact the second electrode 530 of the adjacent pixel area PA. The second electrode 530 of each pixel area PA may extend onto the bank insulating layer 190. The bank insulating layer 190 may be covered by the second electrode 530. In the display apparatus according to the embodiment of the present disclosure, accordingly, the process of forming the second electrode 530 disposed in each pixel area PA may be simplified. In addition, in the display apparatus according to the embodiment of the present disclosure, it may be possible to adjust the luminance of light emitted from the light emitting device 500 of each pixel area PA by the data signal applied to the pixel driving circuit DC of the pixel area PA.

An encapsulation unit 600 may be disposed on the light emitting device 500 of each pixel area PA. The encapsulation unit 600 may prevent damage to the light emitting devices 500 caused by ambient moisture and external impact. The encapsulation unit 600 may extend onto the bezel area BZ of the device substrate 100. The encapsulation unit 600 may include a multilayer structure. For example, the encapsulation unit 600 may include a first encapsulation layer 610, a second encapsulation layer 620, and a third encapsulation layer 630 sequentially stacked on the device substrate 100. The first encapsulation layer 610, the second encapsulation layer 620, and the third encapsulation layer 630 may include an insulating material. The second encapsulation layer 620 may include a material different from those of the first encapsulation layer 610 and the third encapsulation layer 630. For example, each of the first encapsulation layer 610 and the third encapsulation layer 630 may be an inorganic insulating layer made of an inorganic insulating material such as silicon nitride ($SiN_x$) or silicon oxide ($SiO_x$), whereas the second encapsulation layer 620 may be an organic insulating layer made of an organic insulating material. Steps formed by the light emitting devices 500 may be controlled by the second encapsulation layer 620. In the display apparatus according to the embodiment of the present disclosure, accordingly, damage to the light emitting devices 500 caused by ambient moisture and external impact may be effectively prevented.

Light shielding patterns 310, 320, and 330 may be disposed on each pixel area PA of the device substrate 100. Each of the light shielding patterns 310, 320, and 330 may shield light advancing toward the semiconductor pattern 211, 221, or 231 of one of the thin film transistors T1, T2, T3, T4, T5, and T6 disposed in the pixel area PA corresponding to the light shielding pattern 310, 320, or 330 after passing through the device substrate 100. For example, the light shielding patterns 310, 320, and 330 of each pixel area PA may include a first light shielding pattern 310 overlapping with the first semiconductor pattern 211 of the pixel area PA, a second light shielding pattern 320 overlapping with the second semiconductor pattern 221 of the pixel area PA, a third light shielding pattern 330 overlapping with the third semiconductor pattern 231 of the pixel area PA, a fourth light shielding pattern overlapping with the fourth semiconductor pattern of the pixel area PA, a fifth light shielding pattern overlapping with the fifth semiconductor pattern of the pixel area PA, and a sixth light shielding pattern overlapping with the sixth semiconductor pattern of the pixel area PA.

The first light shielding pattern 310 may be disposed between the device substrate 100 and the first semiconductor pattern 211. The first light shielding pattern 310 may include a material capable of reflecting light. For example, the first light shielding pattern 310 may include a metal such as aluminum (Al), chromium (Cr), copper (Cu), molybdenum (Mo), titanium (Ti), and tungsten (W). The first light shielding pattern 310 may be electrically connected to the first gate electrode 213. For example, the first light shielding pattern 310 may function as a dummy gate electrode of the first thin film transistor T1.

The first light shielding pattern 310 may be disposed on the same layer as the circuit gate electrode 293. The first light shielding pattern 310 may include the same material as that of the circuit gate electrode 293. The first light shielding pattern 310 may be formed concurrently (or in some cases, simultaneously) with the circuit gate electrode 293. For example, the first light shielding pattern 310 may be disposed between the lower gate insulating layer 120 and the lower interlayer insulating layer 130. In the display apparatus according to the embodiment of the present disclosure, accordingly, the process of forming the first light shielding pattern 310 may be simplified.

The second light shielding pattern 320 may be disposed between the device substrate 100 and the second semiconductor pattern 221. The second light shielding pattern 320 may include a material capable of reflecting light. For example, the second light shielding pattern 320 may include a metal such as aluminum (Al), chromium (Cr), copper (Cu), molybdenum (Mo), titanium (Ti), and tungsten (W). A specific voltage may be applied to the second light shielding pattern 320. For example, the second light shielding pattern 320 may be electrically connected to the second source electrode 227. In the display apparatus according to the embodiment of the present disclosure, accordingly, a variation in characteristics of the second thin film transistor T2 caused by external light may be effectively prevented.

The second light shielding pattern 320 may include a material different from that of the first light shielding pattern 310. The second light shielding pattern 320 may be disposed on a layer different from that of the first light shielding pattern 310. The vertical distance between the second light shielding pattern 320 and the second semiconductor pattern 221 may be smaller than the vertical distance between the first light shielding pattern 310 and the first semiconductor pattern 211. For example, the second light shielding pattern 320 may be disposed between the lower interlayer insulating layer 130 and the upper buffer layer 140. The first light shielding pattern 310 may be disposed nearer to the device substrate 100 than the second light shielding pattern 320. In the display apparatus according to the embodiment of the present disclosure, accordingly, a parasitic capacitor formed between the second light shielding pattern 320 and the second semiconductor pattern 221 of each pixel area PA may have a greater capacitance than that of a parasitic capacitor formed between the first light shielding pattern 310 and the first semiconductor pattern 211.

Generally, a variation in an effective gate voltage of each thin film transistor may be determined by the following expression. In the following expression, $\Delta V_{eff}$ means a variation in the effective gate voltage, $\Delta V_{GAT}$ means a variation in a voltage applied to a gate electrode of the thin film transistor, C1 means a capacitance of a parasitic capacitor formed between a semiconductor pattern of the thin film transistor and a light shielding pattern disposed under the semiconductor pattern, C2 means a capacitance of a parasitic capacitor formed between the semiconductor pattern and the gate electrode, and $C_{ACT}$ means a capacitance of a parasitic capacitor formed by voltages applied to a source region and a drain region of the semiconductor pattern.

$$\Delta V_{eff} = \frac{C2}{C2 + C_{ACT} + C1} \times \Delta V_{GAT} \quad \text{[Expression]}$$

The capacitance of a capacitor is inversely proportional to the distance between conductors constituting the capacitor. That is, in the display apparatus according to the embodiment of the present disclosure, the variation in the effective gate voltage of the second thin film transistor T2 may be lower than the variation in the effective gate voltage of the first thin film transistor T1. Generally, when the variation in the effective gate voltage of a thin film transistor decreases, an s-factor meaning an inverse ratio of a current variation according to a variation in a voltage applied to a gate electrode of the thin film transistor is increased. In the display apparatus according to the embodiment of the present disclosure, accordingly, the second thin film transistor T2 may have a relatively great s-factor and, as such, a variation in the drive current generated by the second thin film transistor T2, which is caused by a voltage applied to the second gate electrode 223, may be reduced. In the display apparatus according to the embodiment of the present disclosure, accordingly, generation of mura defect at low gray levels may be prevented.

The third light shielding pattern 330 may be disposed between the device substrate 100 and the third semiconductor pattern 231. The third light shielding pattern 330 may include a material capable of reflecting light. For example, the third light shielding pattern 330 may include a metal such as aluminum (Al), chromium (Cr), copper (Cu), molybdenum (Mo), titanium (Ti), and tungsten (W). The third light shielding pattern 330 may be electrically connected to the third gate electrode 233. For example, the third light shielding pattern 330 may function as a dummy gate electrode of the third thin film transistor T3.

The third light shielding pattern 330 may be formed concurrently (or in some cases, simultaneously) with the first light shielding pattern 310. For example, the third light shielding pattern 330 may include the same material as that of the first light shielding pattern 310. In the display apparatus according to the embodiment of the present disclosure, accordingly, an enhancement in process efficiency may be achieved.

The third semiconductor pattern 231 may include a region disposed between the third light shielding pattern 330 and the third gate electrode 233. For example, the third gate electrode 233 may extend across the third channel region of the third semiconductor pattern 231 in a width direction of the third semiconductor pattern 231, and the third light shielding pattern 330 may extend in parallel to the third gate electrode 233. A cross-section of the third light shielding pattern 330 in the width direction of the third semiconductor pattern 231 may have a concave shape. For example, a lower hole LH may be disposed between the device substrate 100 and the third channel region of the third semiconductor pattern 231, and a side wall and a bottom surface of the lower hole LH may be covered by the third light shielding pattern 330. For example, the lower hole LH may extend through the lower buffer layer 110 and the lower gate insulating layer 120. The third light shielding pattern 330 may extend along the side wall and the bottom surface of the lower hole LH. For example, the third light shielding pattern 330 may directly contact the device substrate 100 within the lower hole LH. An end of the third light shielding pattern 330 may be disposed between the lower gate insulating layer 120 and the lower interlayer insulating layer 130.

The third channel region of the third semiconductor pattern 231 may overlap with a concave portion of the third light shielding pattern 330. Due to a step formed by the lower hole LH, a portion of the third gate electrode 233 overlapping with the third channel region of the third semiconductor pattern 231 may be disposed relatively near the device substrate 100. For example, a cross-section of the third gate electrode 233 in the width direction of the third semiconductor pattern 231 may have a concave shape. In the display apparatus according to the embodiment of the present disclosure, accordingly, light L1 reflected from the end of the third light shielding pattern 330 may be reflected in an outward direction of the third semiconductor pattern 231 by the concave shape of the third gate electrode 233. In the display apparatus according to the embodiment of the present disclosure, accordingly, the light L1, which is inwardly reflected, is prevented from being introduced into the third channel region of the third semiconductor pattern 231. That is, in the display apparatus according to the embodiment of the present disclosure, accordingly, a variation in characteristics of the third thin film transistor T3 caused by the inwardly-reflected light may be prevented.

The fourth light shielding pattern may be disposed between the device substrate 100 and the fourth semiconductor pattern. The fifth light shielding pattern may be disposed between the device substrate 100 and the fifth semiconductor pattern. The sixth light shielding pattern may be disposed between the device substrate 100 and the sixth semiconductor pattern. The fourth light shielding pattern, the fifth light shielding pattern, and the sixth light shielding pattern may include a material capable of reflecting light. For example, the fourth light shielding pattern, the fifth light shielding pattern, and the sixth light shielding pattern may include a metal such as aluminum (Al), chromium (Cr), copper (Cu), molybdenum (Mo), titanium (Ti), and tungsten (W). The fourth light shielding pattern, the fifth light shielding pattern, and the sixth light shielding pattern may be disposed on the same layer as the first light shielding pattern 310. For example, the fourth light shielding pattern, the fifth light shielding pattern, and the sixth light shielding pattern may be disposed between the lower gate insulating layer 120 and the lower interlayer insulating layer 130. The fourth light shielding pattern, the fifth light shielding pattern, and the sixth light shielding pattern may include the same material as that of the first light shielding pattern 310. For example, the fourth light shielding pattern, the fifth light shielding pattern, and the sixth light shielding pattern may be formed concurrently (or in some cases, simultaneously) with the first light shielding pattern 310. In the display apparatus according to the embodiment of the present disclosure, accordingly, an enhancement in process efficiency may be achieved.

The fourth light shielding pattern may be electrically connected to the fourth gate electrode. For example, the fourth light shielding pattern may function as a dummy gate electrode of the fourth thin film transistor T4. The fifth light shielding pattern may be electrically connected to the fifth gate electrode. For example, the fifth light shielding pattern may function as a dummy gate electrode of the fifth thin film transistor T5. The sixth light shielding pattern may be electrically connected to the sixth gate electrode. For example, the sixth light shielding pattern may function as a dummy gate electrode of the sixth thin film transistor T6. In the display apparatus according to the embodiment of the present disclosure, accordingly, the efficiency of the pixel driving circuit DC disposed in each pixel area PA may be enhanced.

As apparent from the above description, the display apparatus according to the embodiment of the present disclosure may include the light emitting device 500 and the pixel driving circuit DC disposed in each pixel area PA, wherein the pixel driving circuit DC may include the second thin film transistor T2, which is a driving thin film transistor, and the third thin film transistor T3, which is a sampling thin film transistor, wherein the third thin film transistor T3 may include the third semiconductor pattern 231 disposed on the third light shielding pattern 330, and the third gate electrode 233 disposed on the third semiconductor pattern 231, and wherein cross-sections of the third light shielding pattern 330 and the third gate electrode 233 in the width direction of the third semiconductor pattern 231 may have a concave shape. In the display apparatus according to the embodiment of the present disclosure, accordingly, a variation in characteristics of the third thin film transistor T3 disposed in each pixel area PA, which is caused by inwardly-reflected light, may be prevented. In the display apparatus according to the embodiment of the present disclosure, accordingly, degradation of image quality caused by deviations in characteristics of the second thin film transistor T2 disposed in each pixel area PA may be prevented.

In the display apparatus according to the embodiment of the present disclosure, the pixel driving circuit DC of each pixel area PA has been described as including the six thin film transistors T1, T2, T3, T4, T5, and T6. In a display apparatus according to another embodiment of the present disclosure, however, the pixel driving circuit DC of each pixel area PA may include one driving thin film transistor and a plurality of switching thin film transistors, wherein one of the switching thin film transistors may be a sampling thin film transistor electrically connected between a driving gate electrode and a driving source electrode of the driving thin film transistor. In the display apparatus according to the other embodiment of the present disclosure, accordingly, freedom of the configuration of each pixel driving circuit DC may be enhanced.

In the display apparatus according to the embodiment of the present disclosure, the lower hole LH has been described as extending through the lower buffer layer 110 and the lower gate insulating layer 120. In a display apparatus according to another embodiment of the present disclosure, however, the lower hole LH may extend through one of the lower buffer layer 110 and the lower gate insulating layer 120. For example, in the display apparatus according to the other embodiment of the present disclosure, the lower hole LH may extend through the lower buffer layer 110, and the lower gate insulating layer 120 may extend along the side wall and the bottom surface of the lower hole LH. In the display apparatus according to the other embodiment of the present disclosure, accordingly, freedom of the process of forming the lower hole LH may be enhanced.

Figure 6:
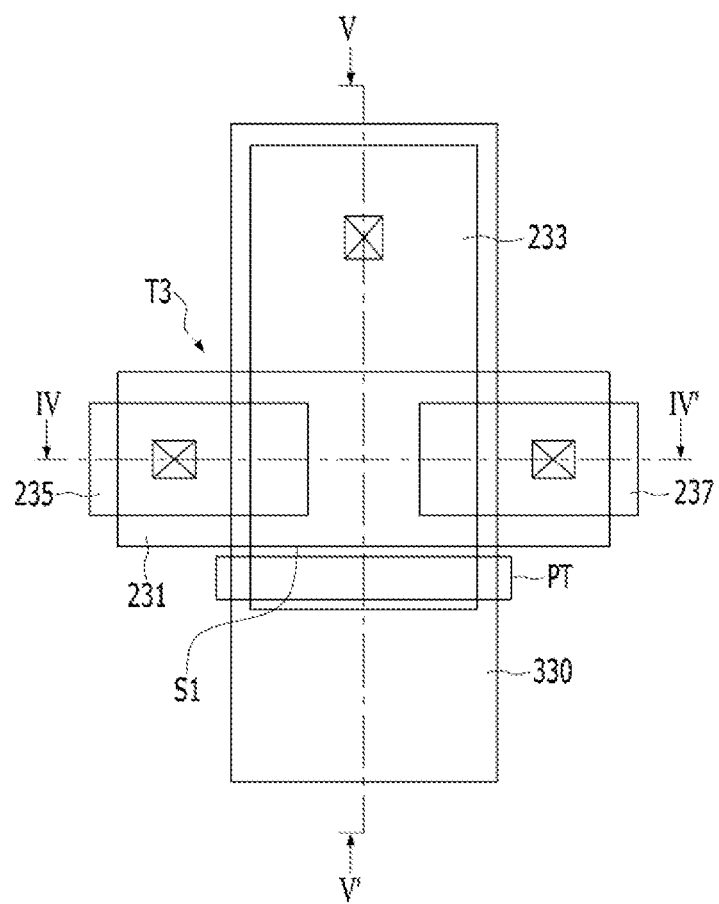
FIGS. 6 to 15 are views showing display apparatuses according to other embodiments of the present disclosure.
Figure 7:
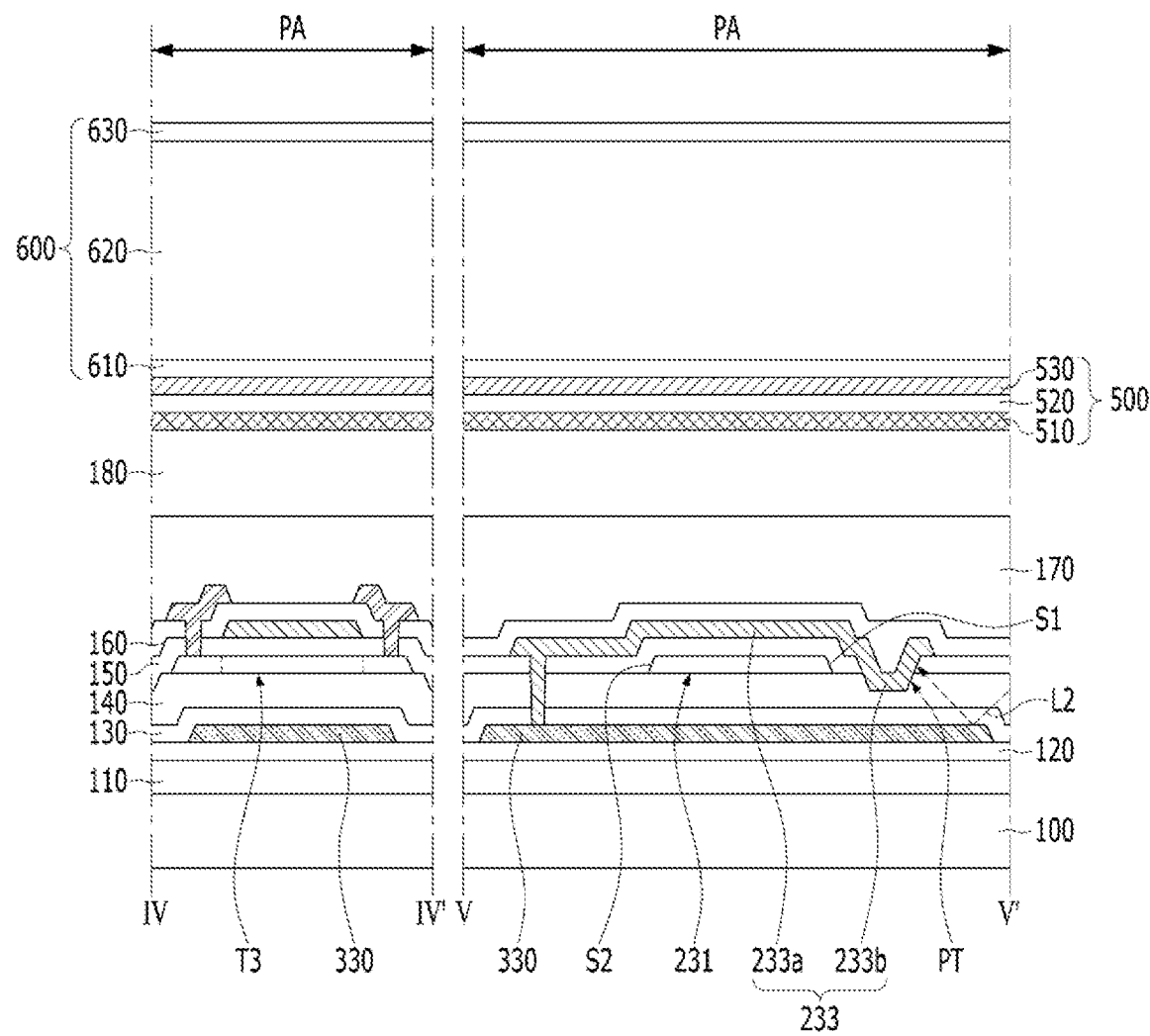

In the display apparatus according to the embodiment of the present disclosure, the third light shielding pattern 330 and the third gate electrode 233, which extend across the third channel region between the third drain region and the third source region, have been described as having cross-sections having a concave shape in a width direction of the third semiconductor pattern 231. In a display apparatus according to another embodiment of the present disclosure, however, light advancing toward the third channel region of the third semiconductor pattern 231 may be shielded by the third gate electrode 233, without formation of the lower hole LH. For example, as shown in FIGS. 6 and 7, in the display apparatus according to the other embodiment of the present disclosure, a light shielding trench PT, which extends through the upper gate insulating layer 150, may be disposed on a first side surface S1 of the third semiconductor pattern 231, and the third gate electrode 233 may include a central region 233a disposed on the third channel region of the third semiconductor pattern 231, and a first electrode region 233b covering a side wall and a bottom surface of the light shielding trench PT. The light shielding trench PT may extend in a longitudinal direction of the third semiconductor pattern 231. For example, the light shielding trench PT may be disposed in parallel to the first side surface S1 of the third channel region. The first electrode region 233b may extend onto the first side surface S1 of the third channel region within the light shielding trench PT. In the display apparatus according to the other embodiment of the present disclosure, accordingly, light L2 reflected from the end of the third light shielding pattern 330 may be reflected in the outward direction of the third semiconductor pattern 231 by the first electrode region 233b of the third gate electrode 233. In the display apparatus according to the other embodiment of the present disclosure, accordingly, a variation in characteristics of the third thin film transistor T3 caused by the inwardly-reflected light may be prevented by the first electrode region 233b of the third gate electrode 233.

The minimum distance between the device substrate 100 and the first electrode region 233b may be smaller than the minimum distance between the device substrate 100 and the third semiconductor pattern 231. For example, the light shielding trench PT may partially extend through the upper buffer layer 140. The bottom surface of the light shielding trench PT may be disposed nearer to the device substrate 100 than an upper surface of the upper buffer layer 140. In the display apparatus according to the other embodiment of the present disclosure, accordingly, light advancing toward the third channel region of the third semiconductor pattern 231 by inward reflection may be effectively shielded. The third gate electrode 233 may be electrically connected to the third light shielding pattern 330 on a second side surface S2 opposite to the first side surface S1 of the third semiconductor pattern 231. For example, the cross-section of the third gate electrode 233 in the width direction of the third semiconductor pattern 231 may have a concave shape with reference to the third semiconductor pattern 231. In the display apparatus according to the other embodiment of the present disclosure, accordingly, a variation in characteristics of the third thin film transistor T3 caused by the inwardly-reflected light may be effectively prevented.

Figure 8:
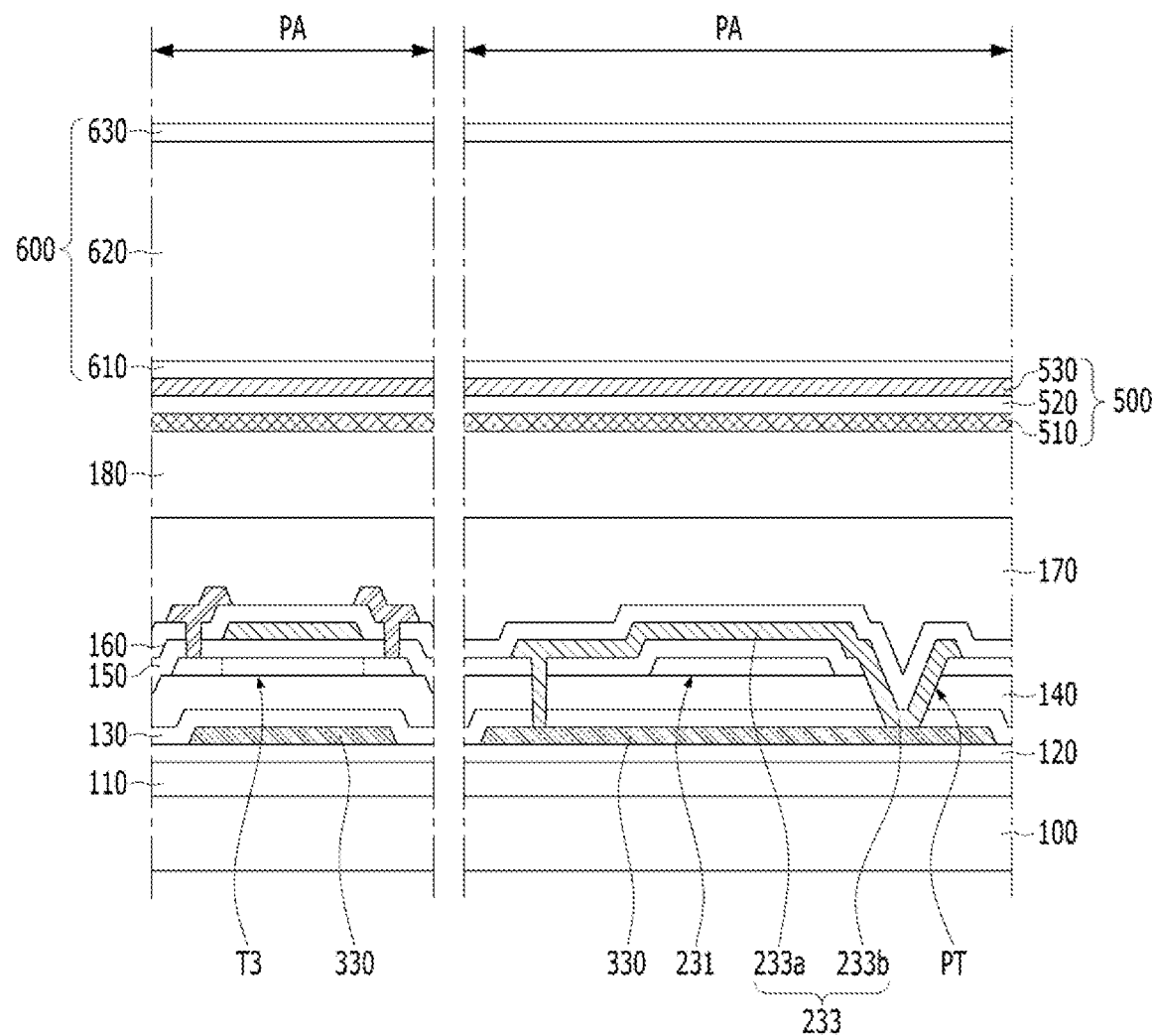

In a display apparatus according to another embodiment of the present disclosure, the first electrode region 233b may be electrically connected to the third light shielding pattern 330. For example, as shown in FIG. 8, in the display apparatus according to the other embodiment of the present disclosure, the light shielding trench PT may extend through the lower interlayer insulating layer 130, the upper buffer layer 140, and the upper gate insulating layer 150, and the first electrode region 233b may directly contact the third light shielding pattern 330 within the light shielding trench PT. In the display apparatus according to the other embodiment of the present disclosure, accordingly, the third gate electrode 233 may be stably connected to the third light shielding pattern 330. In addition, in the display apparatus according to the other embodiment of the present disclosure, introduction of light toward the third channel region of the third semiconductor pattern 231 may be effectively prevented. In the display apparatus according to the other embodiment of the present disclosure, accordingly, degradation of image quality caused by deviations in characteristics of the second thin film transistor T2 disposed in each pixel area PA may be effectively prevented.

Figure 9:
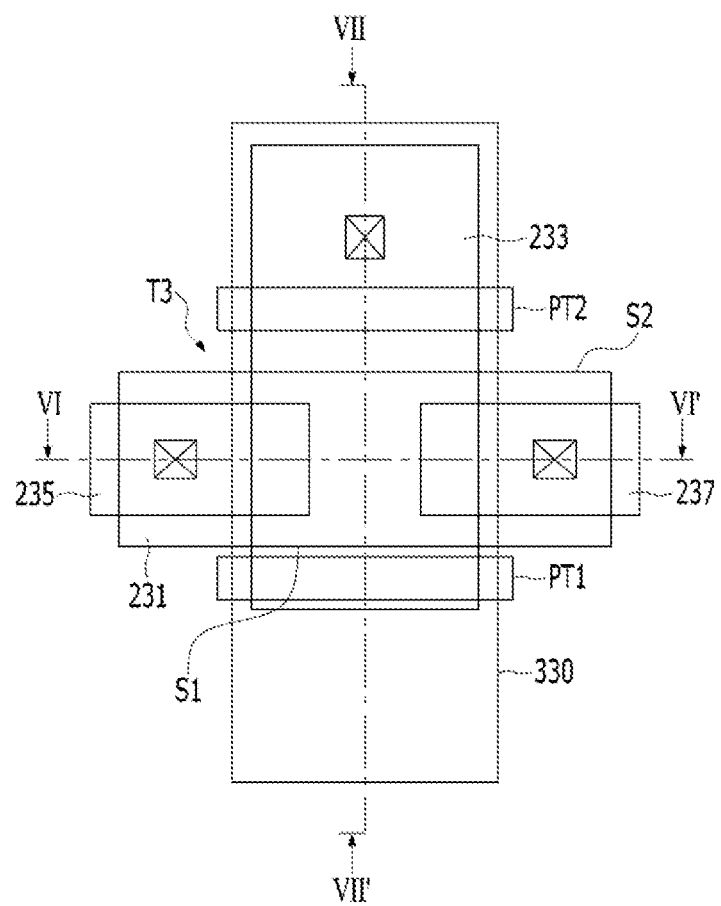
Figure 10:
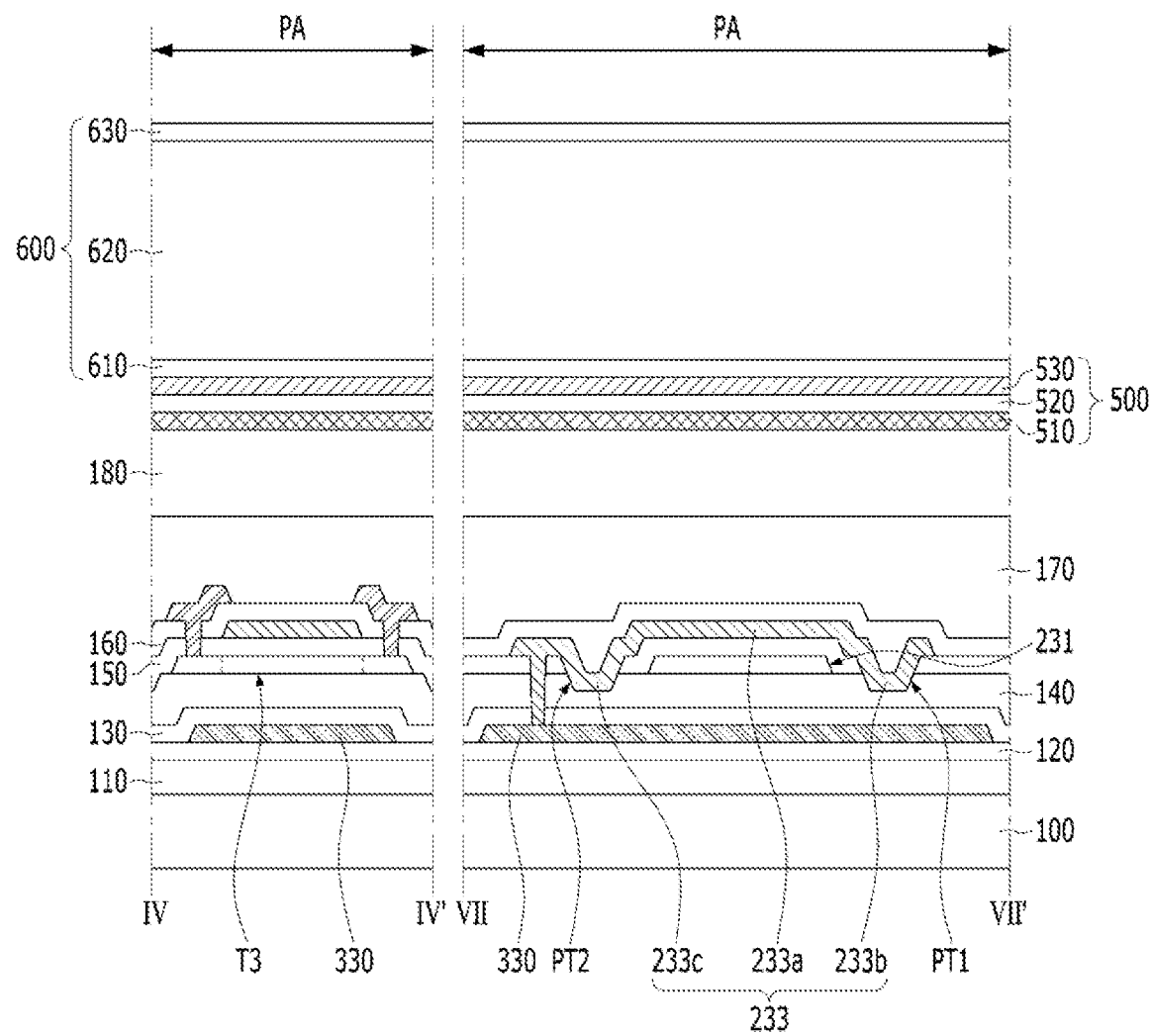

In a display apparatus according to another embodiment of the present disclosure, as shown in FIGS. 9 and 10, a first light shielding trench PT1 may be disposed on the first side surface S1 of the third semiconductor pattern 231, a second light shielding trench PT2 may be disposed on the second side surface S2 of the third semiconductor pattern 231, and the third gate electrode 233 may include a first electrode region 233b disposed in the first light shielding trench PT1, and a second electrode region 233c disposed in the second light shielding trench PT2. For example, a portion of the third gate electrode 233 may have a cap-shaped (inverted U-shaped) cross-section in the width direction of the third semiconductor pattern 231. The first light shielding trench PT1 and the second light shielding trench PT2 may be spaced apart from the third semiconductor pattern 231. The first light shielding trench PT1 and the second light shielding trench PT2 may extend in the longitudinal direction of the third semiconductor pattern 231. For example, the third channel region of the third semiconductor pattern 231 may be disposed between the first light shielding trench PT1 and the second light shielding trench PT2. The length of the second light shielding trench PT2 may be equal to the length of the first light shielding trench PT1. The second light shielding trench PT2 may have the same width as that of the first light shielding trench PT1. For example, the shape of the second light shielding trench PT2 may be identical to the shape of the first light shielding trench PT1.

The first electrode region 233b may cover a side wall and a bottom surface of the first light shielding trench PT1. A side wall and a bottom surface of the second light shielding trench PT2 may be covered by the second electrode region 233c. The third gate electrode 233 may be electrically connected to the third light shielding pattern 330 outside the second light shielding trench PT2. In the display apparatus according to the other embodiment of the present disclosure, accordingly, introduction of inwardly-reflected light into the channel region of the third semiconductor pattern 231 may be effectively prevented.

Figure 11:
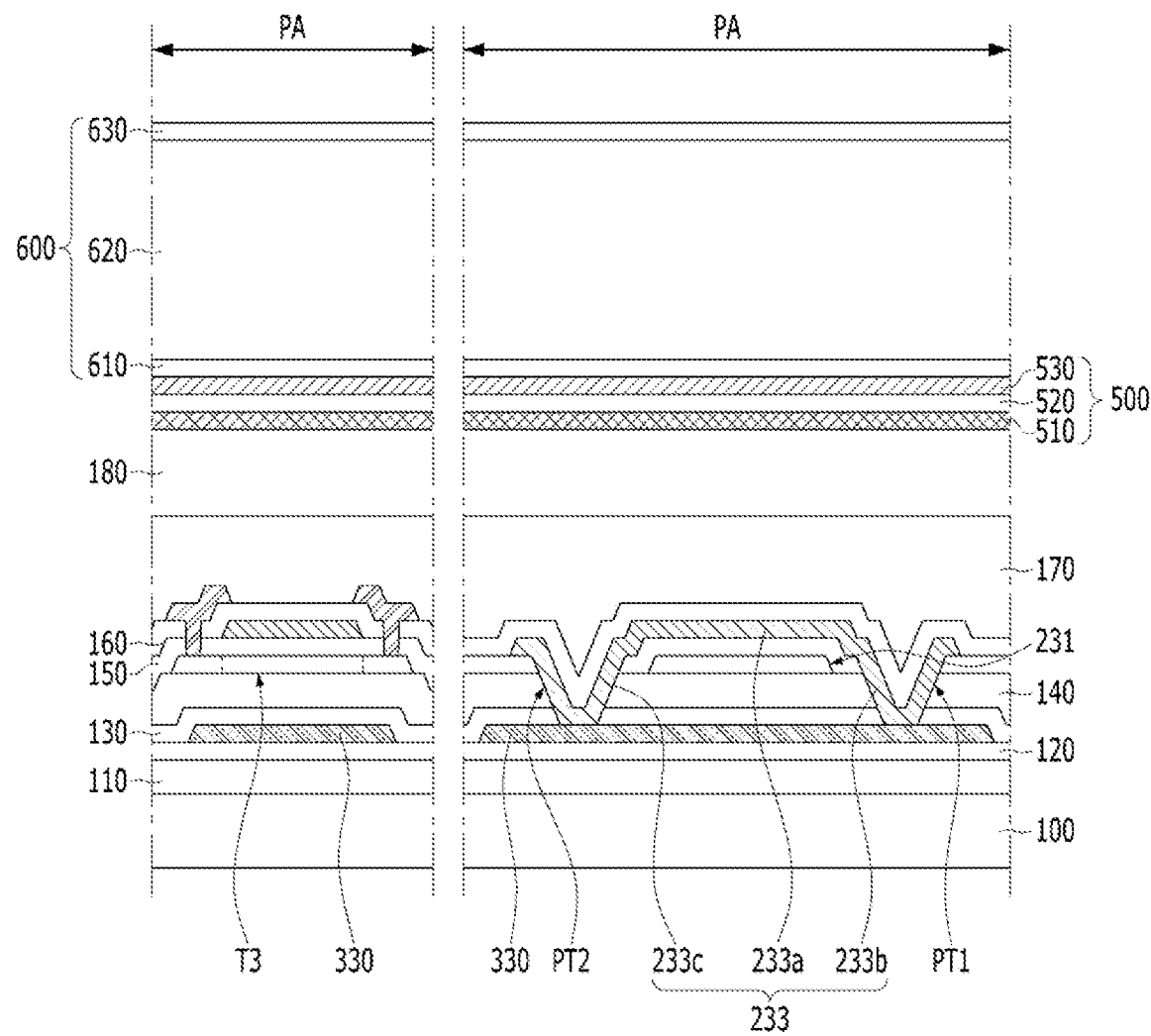

In a display apparatus according to another embodiment of the present disclosure, the third channel region of the third semiconductor pattern 231 may be surrounded by the third light shielding pattern 330 and the third gate electrode 233. For example, as shown in FIG. 11, in the display apparatus according to the other embodiment of the present disclosure, the first light shielding trench PT1 and the second light shielding trench PT2 may extend through the lower interlayer insulating layer 130, the upper buffer layer 140, and the upper gate insulating layer 150, the first electrode region 233b may directly contact the third light shielding pattern 330 within the first light shielding trench PT1, and the second electrode region 233c may directly contact the third light shielding pattern 330 within the second light shielding trench PT2. In the display apparatus according to the other embodiment of the present disclosure, accordingly, light reflected toward the third channel region of the third semiconductor pattern 231 may be effectively shielded by the third gate electrode 233. In addition, in the display apparatus according to the other embodiment of the present disclosure, the third gate electrode 233 may be electrically connected to the third light shielding pattern 330 via the first electrode region 233b and the second electrode region 233c. That is, in the display apparatus according to the other embodiment of the present disclosure, a process of forming a contact hole for electrical connection of the third gate electrode 233 to the third light shielding pattern 330 may be omitted. In the display apparatus according to the other embodiment of the present disclosure, accordingly, an enhancement in process efficiency may be achieved.

Figure 12:
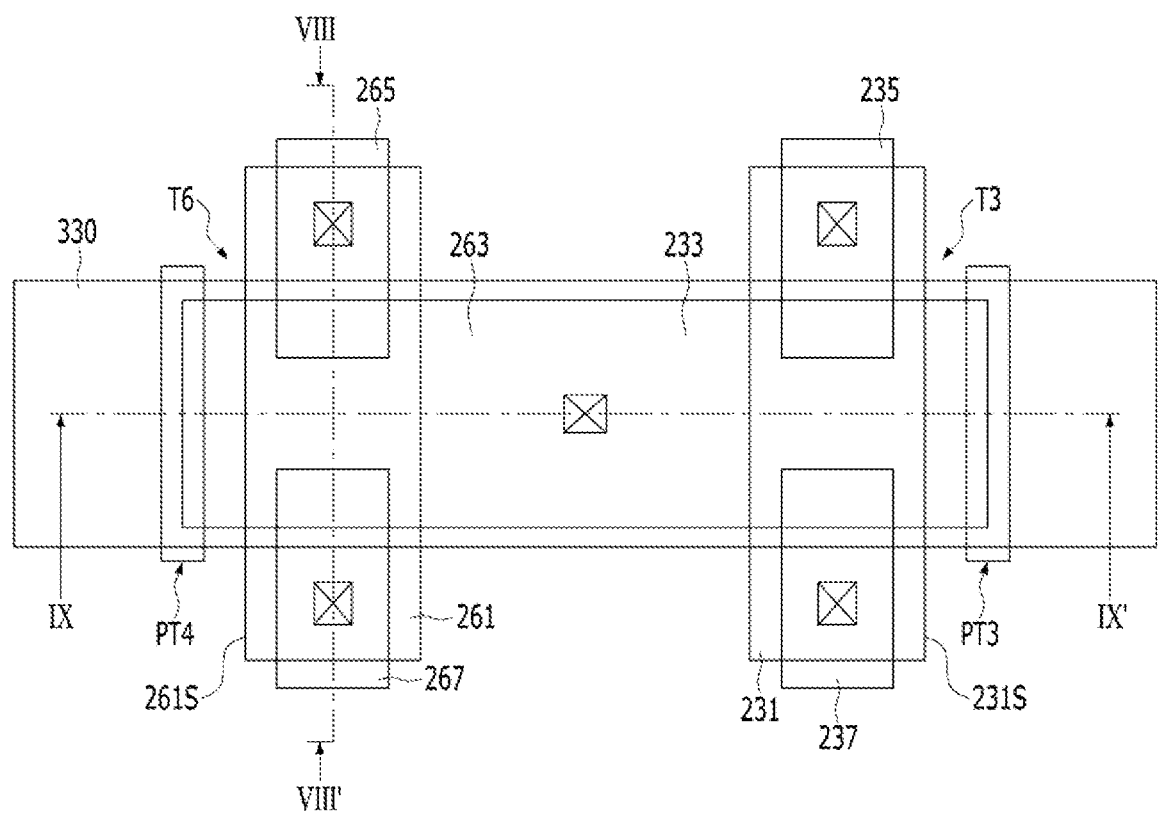
Figure 13:
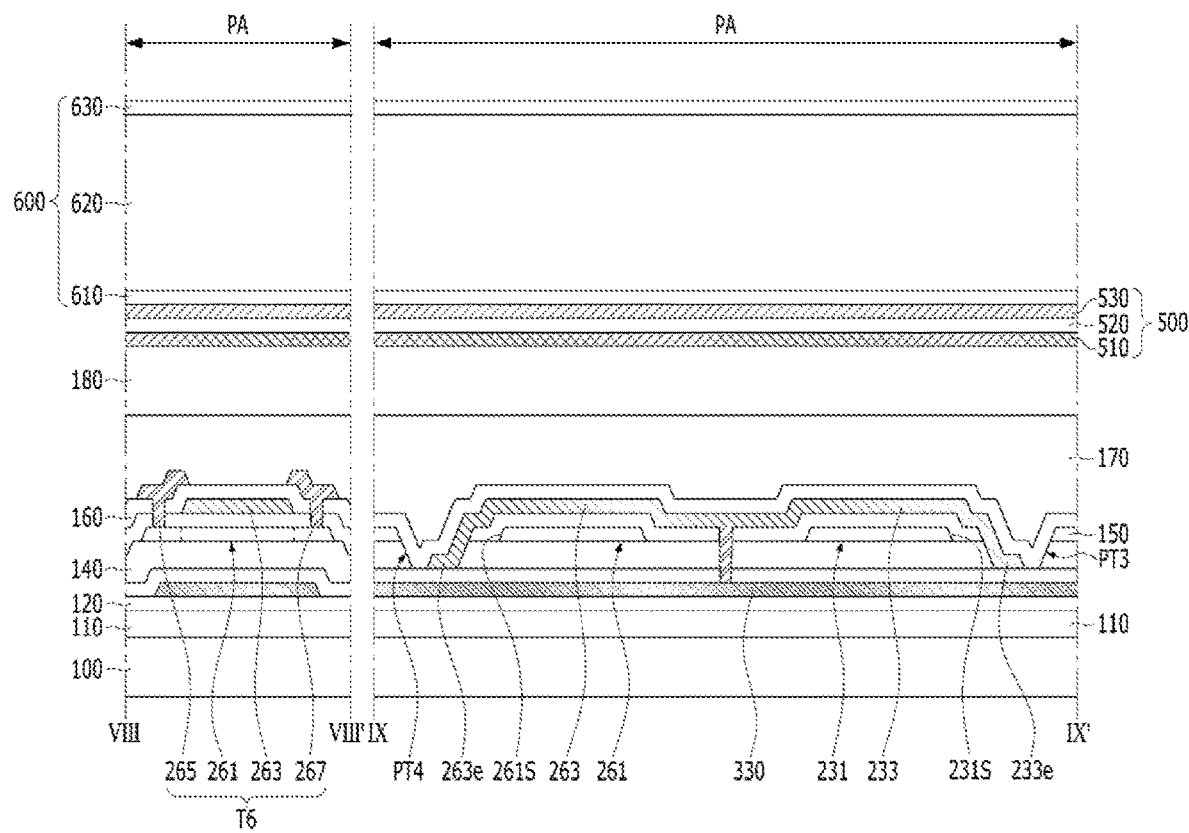

In a display apparatus according to another embodiment of the present disclosure, the third thin film transistor T3 and the sixth thin film transistor T6, which are concurrently (or in some cases, simultaneously) turned on/off by the first gate signal applied thereto through the first gate line GL1, may be disposed in parallel. For example, as shown in FIGS. 12 and 13, in the display apparatus according to the other embodiment of the present disclosure, the third thin film transistor T3 and the sixth thin film transistor T6 may be disposed on the third light shielding pattern 330, the third semiconductor pattern 231 of the third thin film transistor T3 and a sixth semiconductor pattern 261 of the sixth thin film transistor T6 may extend across the third light shielding pattern 330, and the third gate electrode 233 of the third thin film transistor T3 may directly contact a sixth gate electrode 263 of the sixth thin film transistor T6.

The third gate electrode 233 and the sixth gate electrode 263 may be electrically connected to the third light shielding pattern 330 between the third semiconductor pattern 231 and the sixth semiconductor pattern 261. A third light shielding trench PT3 may be disposed on a side surface 231S of the third semiconductor pattern 231 opposite to the sixth semiconductor pattern 261, and a fourth light shielding trench PT4 may be disposed on a side surface 261S of the sixth semiconductor pattern 261 opposite to the third semiconductor pattern 231. The third gate electrode 233 may include an end 233e disposed in the third light shielding trench PT3, and the sixth gate electrode 263 may include an end 263e disposed in the fourth light shielding trench PT4. The end 233c of the third gate electrode 233 and the end 263e of the sixth gate electrode 263 may be disposed nearer to the device substrate 100 than the third semiconductor pattern 231 and the sixth semiconductor pattern 261. For example, the third light shielding trench PT3 and the fourth light shielding trench PT4 may extend through the upper buffer layer 140 and the upper gate insulating layer 150. The end 233e of the third gate electrode 233 may contact the lower interlayer insulating layer 130 within the third light shielding trench PT3, and the end 263e of the sixth gate electrode 263 may contact the lower interlayer insulating layer 130 within the fourth light shielding trench PT4. In the display apparatus according to the other embodiment of the present disclosure, accordingly, freedom of the configuration of each pixel driving circuit DC may be enhanced, and introduction of light into the third channel region of the third semiconductor pattern 231 may be effectively prevented.

Figure 14:
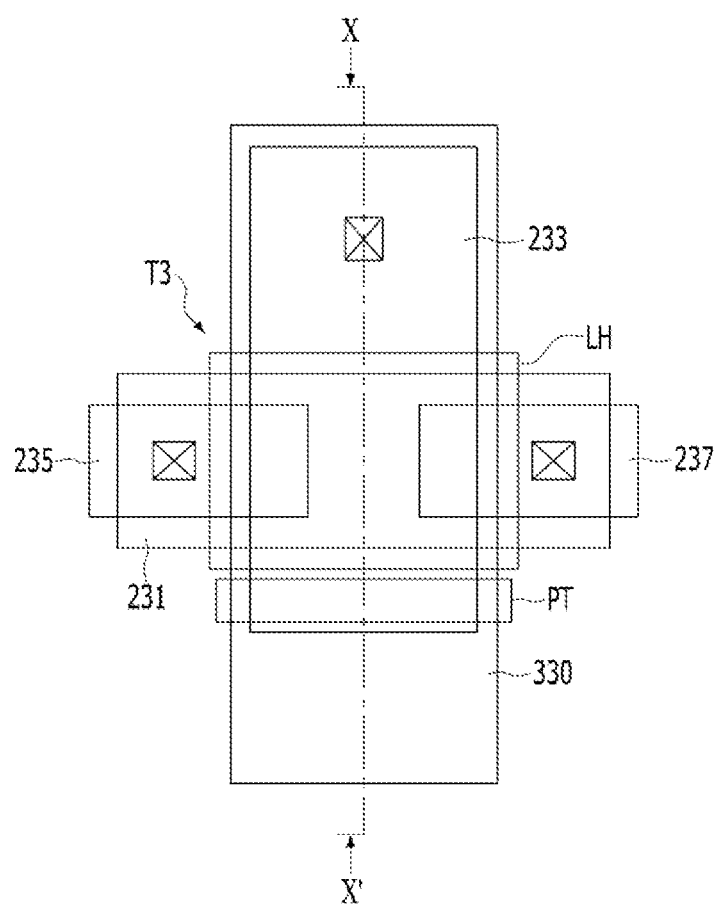
Figure 15:
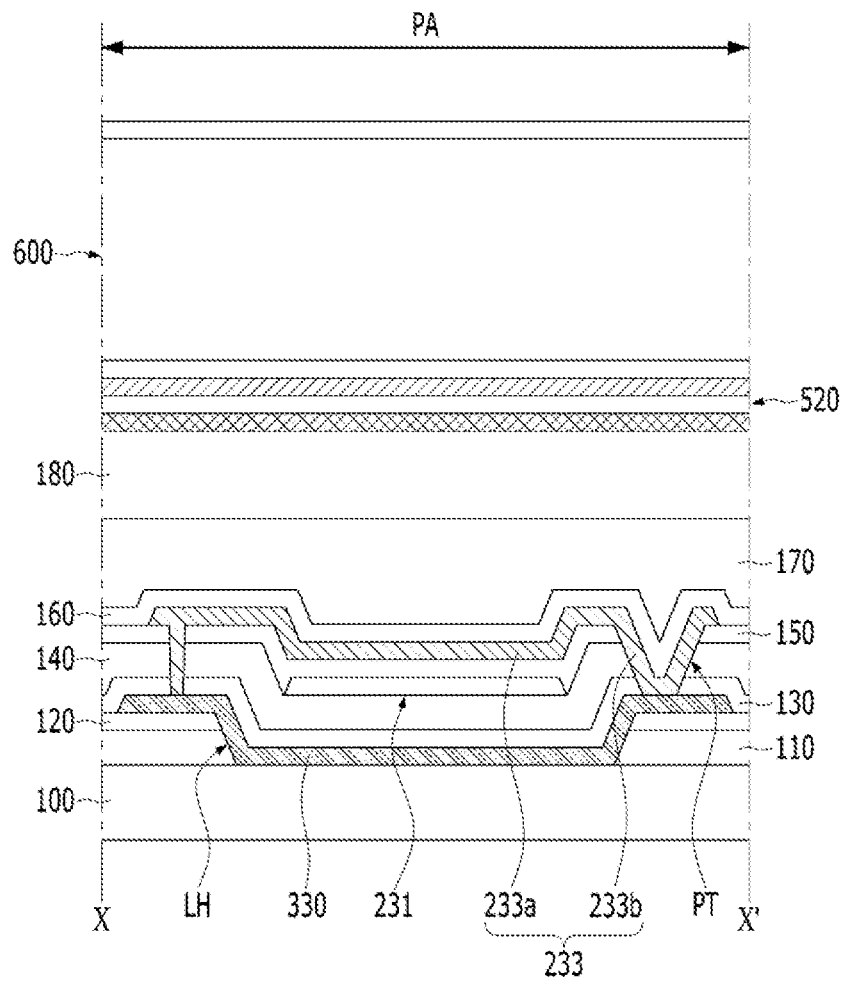

In a display apparatus according to another embodiment of the present disclosure, as shown in FIGS. 14 and 15, a lower hole LH may be disposed between the device substrate 100 and the third channel region of the third semiconductor pattern 231, a light shielding trench PT may be disposed on the first side surface of the third semiconductor pattern 231, and the first electrode region 233b of the third gate electrode 233 may extend along a side wall and a bottom surface of the light shielding trench PT. The first electrode region 233b may directly contact an end of the third light shielding pattern 330 within the light shielding trench PT. In the display apparatus according to the other embodiment of the present disclosure, accordingly, light reflected toward the third channel region of the third semiconductor pattern 231 may be effectively shielded by the third light shielding pattern 330 and the third gate electrode 233. In the display apparatus according to the other embodiment of the present disclosure, accordingly, a variation in characteristics of the third thin film transistor T3 disposed in each pixel area PA, which is caused by inward reflection of light, may be prevented. That is, in the display apparatus according to the other embodiment of the present disclosure, deviations in characteristics of the driving thin film transistor disposed in each pixel area PA, which are caused by introduction of light, may be prevented.

As apparent from the above description, the display apparatus according to each of the embodiments of the present disclosure may include a light emitting device and a pixel driving circuit disposed in each pixel area, wherein the pixel driving circuit may include a driving thin film transistor and a sampling thin film transistor, wherein the sampling thin film transistor may be electrically connected between a driving gate electrode and a driving source electrode of the driving thin film transistor, and may include a sampling semiconductor pattern disposed between a sampling light shielding pattern and a sampling gate electrode of the sampling thin film transistor, and wherein a cross-section of at least one of the sampling light shielding pattern or the sampling gate electrode in a width direction of the sampling semiconductor pattern may have a concave shape with reference to the sampling semiconductor pattern. In the display apparatus according to each of the embodiments of the present disclosure, accordingly, introduction of light into the channel region of the sampling semiconductor pattern disposed in each pixel area may be prevented. In the display apparatus according to each of the embodiments of the present disclosure, accordingly, degradation of image quality caused by deviations in characteristics of the driving thin film transistor disposed in each pixel area may be prevented.

Although the foregoing description has been given mainly in conjunction with embodiments, these embodiments are only illustrative without limiting the disclosure. Those skilled in the art to which the present disclosure pertains can appreciate that various modifications and applications illustrated in the foregoing description may be possible without changing essential characteristics of the embodiments. Therefore, the above-described embodiments should be understood as exemplary rather than limiting in all aspects. In addition, the scope of the present disclosure should also be interpreted by the claims below rather than the above detailed description. All modifications or alterations as would be derived from the equivalent concept intended to be included within the scope of the present disclosure should also be interpreted as falling within the scope of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display apparatus, comprising:
  a sampling light shielding pattern disposed on a device substrate;
  an upper buffer layer disposed on the device substrate while covering the sampling light shielding pattern;
  a pixel driving circuit disposed on the upper buffer layer, the pixel driving circuit including:
    a driving thin film transistor including a driving gate electrode and a driving source electrode; and
    a plurality of switching thin film transistors including a sampling thin film transistor electrically connected between the driving gate electrode and the driving source electrode of the driving thin film transistor; and
  a light emitting device disposed on the device substrate and electrically connected to the pixel driving circuit,
  wherein the sampling thin film transistor comprises a sampling gate electrode overlapping with the sampling light shielding pattern, and a sampling semiconductor pattern disposed between the sampling light shielding pattern and the sampling gate electrode, and
  wherein the sampling gate electrode comprises a first electrode region extending onto a first side surface of the sampling semiconductor pattern.

2. The display apparatus according to claim 1, wherein the sampling gate electrode is electrically connected to the sampling light shielding pattern.

3. The display apparatus according to claim 2, wherein:
the sampling semiconductor pattern comprises a second side surface opposite to the first side surface; and
the sampling gate electrode comprises a second electrode region extending onto the second side surface of the sampling semiconductor pattern.

4. The display apparatus according to claim 3, further comprising:
an upper gate insulating layer disposed between the sampling semiconductor pattern and the sampling gate electrode,
wherein the upper gate insulating layer comprises a first light shielding trench disposed on the first side surface of the sampling semiconductor pattern, and a second light shielding trench disposed on the second side surface of the sampling semiconductor pattern.

5. The display apparatus according to claim 4, wherein a side wall and a bottom surface of the first light shielding trench spaced apart from the sampling semiconductor pattern are covered by the first electrode region.

6. The display apparatus according to claim 5, wherein a side wall and a bottom surface of the second light shielding trench spaced apart from the sampling semiconductor pattern are covered by the second electrode region.

7. The display apparatus according to claim 2, wherein the first electrode region of the sampling gate electrode contacts the sampling light shielding pattern.

8. The display apparatus according to claim 1, further comprising:
a lower buffer layer disposed between the device substrate and the upper buffer layer.

9. The display apparatus according to claim 8, wherein the lower buffer layer comprises a lower hole overlapping with a channel region of the sampling semiconductor pattern.

10. The display apparatus according to claim 9, wherein the sampling light shielding pattern extends along a side wall and a bottom surface of the lower hole.

11. The display apparatus according to claim 1, wherein a minimum distance between the device substrate and the first electrode region is smaller than a minimum distance between the device substrate and the sampling semiconductor pattern.

12. A display apparatus, comprising:
a pixel driving circuit disposed on a device substrate, the pixel driving circuit including:
a driving thin film transistor including a driving gate electrode and a driving source electrode; and
a sampling thin film transistor including a sampling gate electrode and a sampling semiconductor pattern;
a sampling light shielding pattern disposed between the device substrate and the sampling semiconductor pattern of the sampling thin film transistor; and
a light emitting device disposed on the device substrate and electrically connected to the pixel driving circuit,
wherein the sampling thin film transistor is electrically connected between the driving gate electrode and the driving source electrode of the driving thin film transistor, and
wherein a cross-section of at least one of the sampling light shielding pattern or the sampling gate electrode of the sampling thin film transistor has a concave shape with reference to the sampling semiconductor pattern.

13. The display apparatus according to claim 12, further comprising:
a driving light shielding pattern disposed between the device substrate and a driving semiconductor pattern of the driving thin film transistor;
a lower buffer layer disposed between the device substrate and the driving light shielding pattern.

14. The display apparatus according to claim 13, wherein the lower buffer layer comprises a lower hole overlapping with a channel region of the sampling semiconductor pattern, and
wherein a side wall and a bottom surface of the lower hole are covered by the sampling light shielding pattern.

15. The display apparatus according to claim 14, wherein the sampling light shielding pattern contacts the device substrate within the lower hole.

16. The display apparatus according to claim 14, wherein the sampling light shielding pattern is disposed on a layer different from a layer on which the driving light shielding pattern is disposed.

17. The display apparatus according to claim 12, wherein:
the driving thin film transistor comprises a driving semiconductor pattern disposed on a same layer as the sampling semiconductor pattern; and
each of the driving semiconductor pattern and the sampling semiconductor pattern comprises an oxide semiconductor.

18. The display apparatus according to claim 17, wherein the driving semiconductor pattern comprises a material identical to a material of the sampling semiconductor pattern.

19. The display apparatus according to claim 12, wherein each of the sampling light shielding pattern and the sampling gate electrode comprises a metal.

20. The display apparatus according to claim 12, wherein the sampling light shielding pattern and the sampling gate electrode extend across a channel region of the sampling semiconductor pattern in a width direction of the sampling semiconductor pattern.

* * * * *